United States Patent
Tsvelykh et al.

(10) Patent No.: US 10,056,922 B1
(45) Date of Patent: Aug. 21, 2018

(54) RADIO FREQUENCY DEVICE MODULES AND METHODS OF FORMATION THEREOF

(71) Applicant: Infineon Technologies AG, Neubiberg (DE)

(72) Inventors: Ivan Tsvelykh, Munich (DE); Samo Vehovc, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/623,115

(22) Filed: Jun. 14, 2017

(51) Int. Cl.
| | |
|---|---|
| *H04B 1/40* | (2015.01) |
| *H01Q 3/00* | (2006.01) |
| *H01Q 21/00* | (2006.01) |
| *H01L 21/71* | (2006.01) |
| *H04B 1/04* | (2006.01) |
| *H01P 3/08* | (2006.01) |
| *H01P 1/20* | (2006.01) |
| *H01L 23/66* | (2006.01) |

(52) U.S. Cl.
CPC ............... *H04B 1/04* (2013.01); *H01L 23/66* (2013.01); *H01P 1/20* (2013.01); *H01P 3/08* (2013.01); *H01L 2223/6627* (2013.01); *H01L 2223/6677* (2013.01)

(58) Field of Classification Search
CPC ...... H01Q 3/00; H01Q 21/00; H01Q 21/0006; H04B 1/40; H01L 21/00; H01L 21/70; H01L 23/28; H01L 23/52
See application file for complete search history.

(56) References Cited

U.S. PATENT DOCUMENTS

| | | | |
|---|---|---|---|
| 6,147,572 A * | 11/2000 | Kaminski | ................. H01P 1/20 333/134 |
| 7,057,564 B2 | 6/2006 | Tsai et al. | |
| 7,873,326 B2 * | 1/2011 | Sadr | ..................... G06K 7/0008 343/700 MS |
| 7,889,147 B2 | 2/2011 | Tam et al. | |
| 8,659,369 B2 | 2/2014 | Rofougaran et al. | |
| 8,836,596 B2 * | 9/2014 | Richards | ............. H01Q 19/005 333/202 |
| 8,860,532 B2 * | 10/2014 | Gong | ..................... H01P 1/208 333/202 |
| 9,172,132 B2 | 10/2015 | Kam et al. | |
| 9,413,079 B2 | 8/2016 | Kamgaing et al. | |
| 2007/0210959 A1 | 9/2007 | Herd et al. | |
| 2009/0153428 A1 * | 6/2009 | Rofougaran | ............ H01L 23/66 343/787 |
| 2015/0325925 A1 | 11/2015 | Kamgaing et al. | |

OTHER PUBLICATIONS

Simon, W., et al., "Highly Integrated KA-Band Tx Frontend Module Including 8×8 Antenna Array," Asia Pacific Microwave Conference, Dec. 7-10, 2009, 63 pages, IMST GmbH, Germany.

* cited by examiner

*Primary Examiner* — Blane Jackson
(74) *Attorney, Agent, or Firm* — Slater Matsil, LLP

(57) ABSTRACT

A method of operating a radio frequency (RF) module includes filtering, by a substrate integrated waveguide (SIW) band-pass filter, an RF signal propagating between an antenna and an interface structure. The antenna is disposed at a first side of a substrate. The interface structure is disposed at a second side of the substrate opposite the first side The SIW band-pass filter is disposed within the substrate between the antenna and the interface structure. The method of operating the RF module further includes transferring, by the interface structure, the RF signal between the SIW band-pass filter and an RF front end circuit.

23 Claims, 18 Drawing Sheets

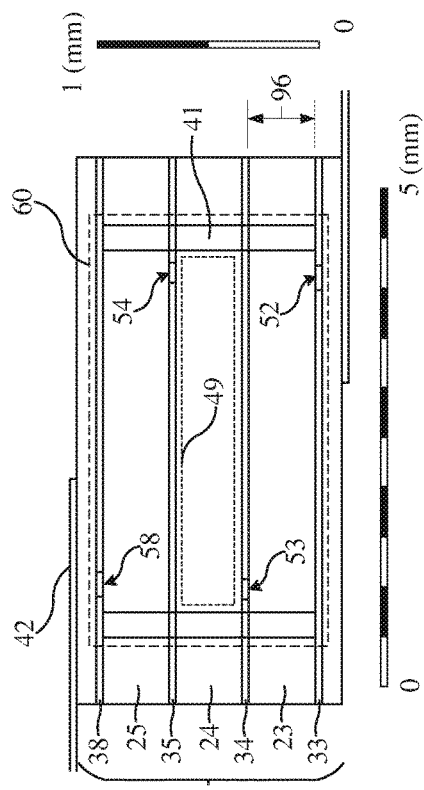
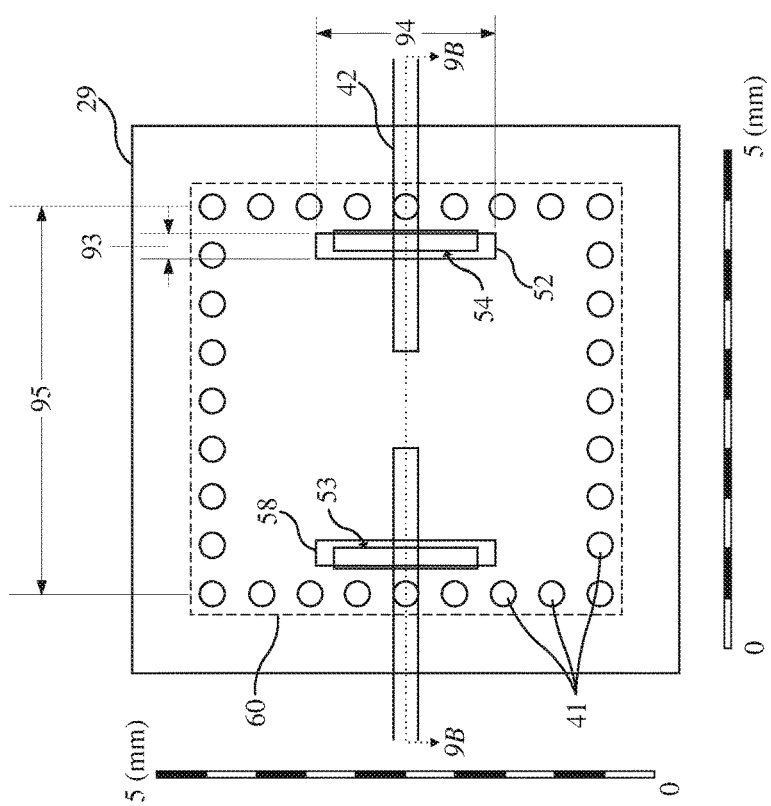
Fig. 10B
Fig. 10A

RADIO FREQUENCY DEVICE MODULES AND METHODS OF FORMATION THEREOF

TECHNICAL FIELD

The present invention relates generally to a radio frequency electronic device, and, in particular embodiments, to radio frequency electronic device modules and the methods of formation thereof.

BACKGROUND

Many wireless communication technologies now utilize systems of multiple antennas for various applications such as beamforming, transmit diversity, and multiple input, multiple output (MIMO) configurations. Serving devices such as base stations may incorporate one or more antenna arrays to increase network capacity. Additionally, portable devices such as tablets, smart phones, and smart watches have become popular recently due to the rapid advancement in low-cost semiconductor technologies. Portable devices may also utilize multiple antenna elements for beamforming, transmit diversity and MIMO configurations. Another application of multiple antennas for portable devices is as radar sensors that can detect user motions (known as gesture sensors) which may be configured in a portable device as an interface to control functionality of the device. Many portable devices are necessarily small so embedded radar systems with reduced form factors are desirable. Modules capable of directional communication and radar sensing may have very densely packed components. As a result, component size and location within the package may be a priority during package design of integrated multi-antenna systems.

SUMMARY

In accordance with an embodiment of the invention, a method of operating a radio frequency (RF) module includes filtering, by a substrate integrated waveguide (SIW) band-pass filter, an RF signal propagating between an antenna and an interface structure. The antenna is disposed at a first side of a substrate. The interface structure is disposed at a second side of the substrate opposite the first side The SIW band-pass filter is disposed within the substrate between the antenna and the interface structure. The method of operating the RF module further includes transferring, by the interface structure, the RF signal between the SIW band-pass filter and an RF front end circuit.

In accordance with another embodiment of the invention, a radio frequency (RF) module includes an antenna, an interface structure, and a substrate integrated waveguide (SIW) band-pass filter. The antenna is disposed at a first side of a substrate. The interface structure is disposed at a second side of the substrate opposite the first side. The SIW band-pass filter is disposed within the substrate between the antenna and the interface structure. The SIW band-pass filter is configured to filter an RF signal propagating between the antenna and the interface structure. The interface structure is configured to be coupled to an RF front end circuit.

In accordance with still another embodiment of the invention, a semiconductor device module includes a first antenna disposed at a first laminate layer of a substrate. The first laminate layer is disposed at a first side of the substrate. The semiconductor device module further includes a first band-pass filter coupled to the first antenna. The first band-pass filter includes a first waveguide cavity disposed in a second laminate layer of the substrate. The second laminate layer is disposed below the first laminate layer. The semiconductor device module further includes an interface structure coupled to the first band-pass filter. The interface structure is disposed at a third laminate layer of the substrate. The third laminate layer is disposed at a second side of the substrate opposite the first side of the substrate. The interface structure is configured to be coupled to a radio frequency integrated circuit (RFIC) chip.

BRIEF DESCRIPTION OF THE DRAWINGS

For a more complete understanding of the present invention, and the advantages thereof, reference is now made to the following descriptions taken in conjunction with the accompanying drawings, in which:

FIGS. 10A and 10B illustrate a substrate integrated waveguide band-pass filter in accordance with an embodiment of the invention, where FIG. 10A illustrates a top view of the substrate integrated waveguide band-pass filter, and FIG. 10B illustrates a cross-sectional view of the substrate integrated waveguide band-pass filter;

Figure 1A:
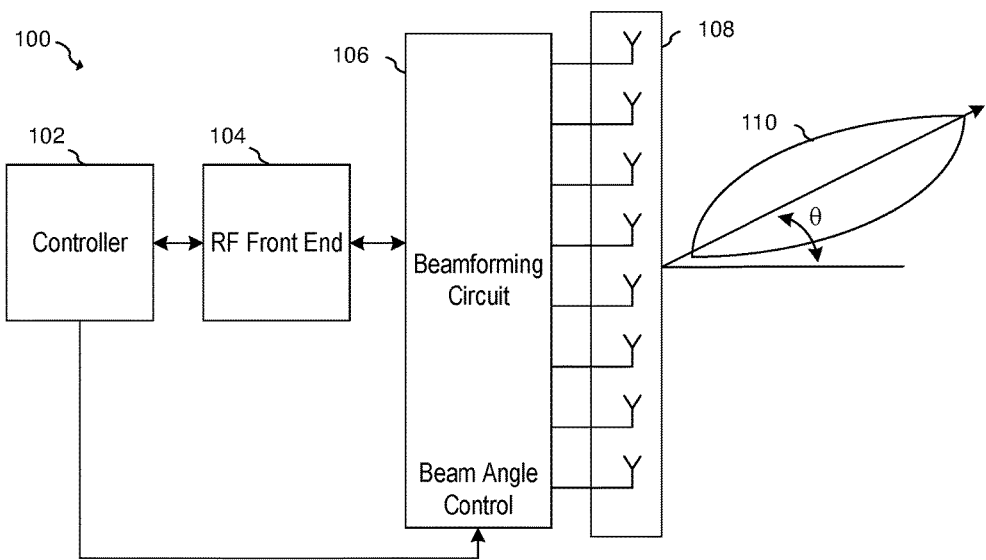
FIG. 1A illustrates an example electronically steerable array RF system.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

The present disclosure will be described with respect to embodiments in a specific context, radio frequency device modules that are used for electronically steerable active phased array antenna that may be used in RF systems such as radar systems and cellular communication systems. Embodiments of the present invention may also be applied to other systems and applications that receive or transmit directional RF signals.

Electronically steerable antenna arrays are suitable for use in a number of applications such as telecommunications, automotive radar, industrial radar, gesture sensors, and motion detectors. In telecommunication applications, multichannel transceivers may be used for point-to-point communication where beamforming is needed. For example, upcoming $5^{th}$ generation (5G) mobile technologies may employ various features that utilize multiple antenna elements such as adaptive beamforming for dedicated users, smart antenna scenarios, transmit diversity, and multiple input, multiple output (MIMO) configurations.

A phased array antenna system may be implemented as an array of individual antennas that are configured to transmit a beam of radio waves in an electronically controllable direction without physically moving the individual antenna elements. A phased array may be a passive phased array where all antennas are connected to a single transmit/receive module (TRM), an active phased array where each antenna is connected to a different TRM, or a combination where groups of antennas are connected to respective TRMs. Active phased array antenna modules may be used as the building blocks of base stations for 5G communication.

An active phased array may also be referred to as an active electronically scanned array (AESA). Similarly, a passive phased array may be referred to as a passive electronically scanned array (PESA).

Possible sensing applications include level monitoring in storage tanks, smart lighting control, security systems, intelligent door openers, and collision avoidance in vehicles, among others. Multichannel radar systems are primarily used instead of single-channel systems when detection of the angular position of an object is important. When an AESA is used in a radar application, the system may be referred to as an active phased array radar (APAR).

In order to minimize the size of an RF module containing an array of antenna elements, many of the components of the radio frequency front end circuit may be integrated on a RFIC chip. The RFIC chip size may be limited by a lattice spacing or a pitch of the antenna elements in the array, which in turn may be dependent on the desired operational frequency range. For example, at 28 GHz, the distance between two elements may be about 5-6.5 mm. At 60 GHz, this distance may range between about 3 and about 3.5 mm. It may be beneficial for the components of the radio frequency front end circuit corresponding to each antenna to fit into an area smaller than the lattice spacing. This may allow the overall size of the module to be the dimensions of the antenna array in a phased array antenna system.

A possible design consideration of radio frequency modules is the generation of spurious emissions and/or out-of-band emissions. RF signals transmitted far outside of the desired operation range of a radio frequency device may be considered spurious emissions. The unwanted generation of spurious emissions and out-of-band emissions may be reduced or eliminated using filters. For example, a band-pass filter is a type of filter that processes an input signal containing a broad range of frequencies and outputs only the frequencies in the passband of the band-pass filter. In other words, a band-pass filter passes frequencies in the passband through the device and rejects or attenuates frequencies outside of the passband. However, RF band-pass filters may be bulky which may increase the size of the radio frequency module.

FIG. 1A illustrates an example embodiment of an electronically steerable array RF system 100 that includes controller 102, RF front-end 104, beamforming circuit 106 and electronically steerable array antenna 108. During operation, controller 102 determines a beam angle θ at which electronically steerable array antenna 108 transmits and receives RF beam 110 via a beam angle control port. In some embodiments, controller 102 may provide a global relative time delay setting and/or time delay parameters and settings for each time delay circuit or for groups of time delay circuits within beamforming circuit 106. In some embodiments, for example, in cellular communication systems, controller 102 may perform baseband processing. RF front-end 104 provides and/or receives an RF signal to and from beamforming circuit 106. Beamforming circuit 106 provides individual RF signals to electronically steerable array antenna 108 that are delayed according to the requested beam angle and the spacing between antenna elements of the electronically steerable array antenna 108.

While FIG. 1A only shows the electronically steerable array antenna 108 as having eight antenna elements arranged as a one-dimensional array, in alternative embodiments of the present invention electronically steerable array antenna 108 may have greater or fewer than eight elements and/or may have its elements arranged in a multi-dimensional array.

Figure 1B:
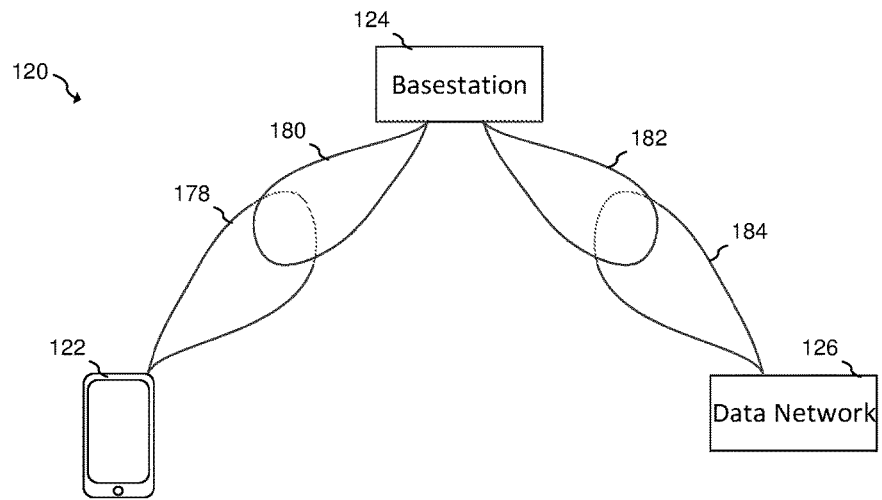
FIG. 1B illustrates an example telecommunications use scenario using embodiment active phased array RF systems.

FIG. 1B illustrates an example telecommunications use scenario using embodiment active phased array RF systems. As shown, mobile device 122, which could be a cellphone, smartphone, or other RF enabled device transmits data to basestation 124 via a directional RF beam 178 and basestation 124 transmits data to mobile device 122 via directional RF beam 180. Similarly, basestation 124 and data network 126 transmits data to each other via directional RF beams 182 and 184 in a backhaul connection. Directional RF beams 178, 180, 182 and 184 may be produced by embodiment beamforming circuits and antenna arrays.

Figure 1C:
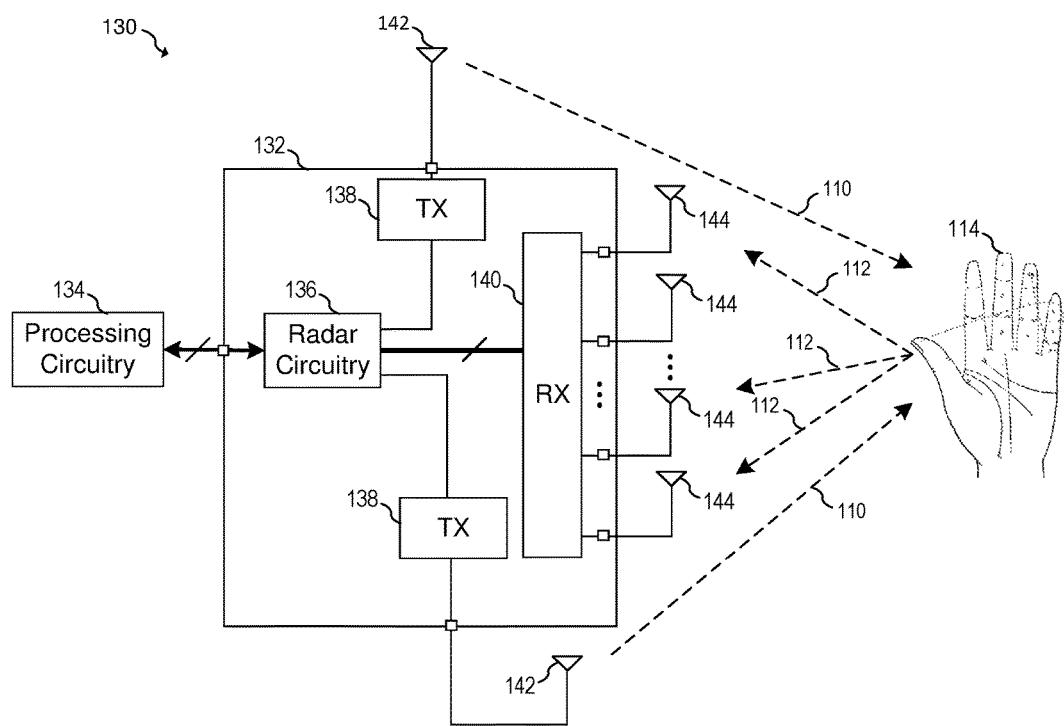
FIG. 1C illustrates a block diagram of an embodiment radar system that includes a radar front end circuit and processing circuitry.

In additional to communication systems, embodiment beamforming circuits and active phased array RF systems can be applied to radar systems, such as automotive radar systems, gesture recognition radar systems and other types of radar systems. FIG. 1C illustrates a block diagram of radar system 130 that includes radar front end circuit 132 and processing circuitry 134. During operation, the position and behavior of target 114 may be detected by the radar system 130. While target 114 is depicted in FIG. 1C as being a hand, radar system 130 may also be configured to determine the position and behavior of other types of targets such as a human body, automobiles, machinery and other types of animate or inanimate objects. Radar system 130 may be implemented, for example, using a two-dimensional mm-wave phased array radar that measures the position and relative speed of target 114. The mm-wave phased array radar transmits and receives signals in the 50 GHz to 80 GHz range. Alternatively, frequencies outside of this range may also be used. In some embodiments, radar front end circuit 132 operates as a frequency modulated continuous wave (FMCW) radar sensor having multiple transmit and receive channels. Alternatively, other types of radar systems may be used.

Radar front end circuit 132 transmits and receives radio signals for detecting target 114 in three-dimensional space. For example, radar front end circuit 132 transmits an incident RF signal and receives an RF signal that is a reflection of the incident RF signal from target 114. The received reflected RF signal is downconverted by radar front end circuit 132 to determine beat frequency signals. These beat frequency signals may be used to determine information such as the location, speed, angle, etc., of target 114 in three-dimensional space.

In various embodiments, radar front end circuit 132 is configured to transmit incident RF signals toward target 114 via transmit antennas 142 and to receive reflected RF signals from target 114 via receive antennas 144. Radar front end circuit 132 includes transmitter front end circuits 138 coupled to transmit antennas 142 and receiver front end circuit 140 coupled to receive antennas 144.

During operation, transmitter front end circuits 138 may transmit RF signals toward target 114 one at a time or simultaneously. While two transmitter front end circuits 138 are depicted in FIG. 1C, it should be appreciated that radar front end circuit 132 may include fewer or greater than two transmitter front end circuits 138. Each transmitter front end circuit 138 includes circuitry configured to produce the incident RF signals. Such circuitry may include, for example, RF oscillators, upconverting mixers, RF amplifiers, variable gain amplifiers, filters, transformers, power splitters, and other types of circuits.

Receiver front end circuit 140 receives and processes the reflected RF signals from target 114. As shown in FIG. 1C, receiver front end circuit 140 is configured to be coupled to four receive antennas 144, which may be configured as a 2×2 antenna array. In alternative embodiments, receiver front end circuit 140 may be configured to be coupled to greater or fewer than four antennas, with the resulting antenna array being of various n×m dimensions depending on the specific embodiment and its specifications. Receiver front end circuit 140 may include, for example, RF oscillators, upconverting mixers, RF amplifiers, variable gain amplifiers, filters, transformers, power combiners and other types of circuits.

Radar circuitry 136 provides signals to be transmitted to transmitter front end circuits 138, receives signals from receiver front end circuit 140, and may be configured to control the operation of radar front end circuit 132. In some embodiments, radar circuitry 136 includes, but is not limited to, frequency synthesis circuitry, upconversion and downconversion circuitry, variable gain amplifiers, analog-to-digital converters, digital-to-analog converters, digital signal processing circuitry for baseband signals, bias generation circuits, and voltage regulators.

Radar circuitry 136 may receive a baseband radar signal from processing circuitry 134 and control a frequency of an RF oscillator based on the received baseband signal. In some embodiments, this received baseband signal may represent a FMCW frequency chip to be transmitted. Radar circuitry 136 may adjust the frequency of the RF oscillator by applying a signal proportional to the received baseband signal to a frequency control input of a phase locked loop. Alternatively, the baseband signal received from processing circuitry 134 may be upconverted using one or more mixers. Radar circuitry 136 may transmit and digitize baseband signals via a digital bus (e.g., a USB bus), transmit and receive analog signals via an analog signal path, and/or transmit and/or receive a combination of analog and digital signals to and from processing circuitry 134.

Processing circuitry 134 acquires baseband signals provided by radar circuitry 136 and performs one or more signal processing steps to evaluate them. In an embodiment, processing circuitry 134 acquires a baseband signal that represents the beat frequency signals. The signal processing steps may include performing a fast Fourier transform (FFT), a short-time Fourier transform (STFT), target classification, machine learning, and the like. Results of the signal processing steps are used to determine and perform an action on the device. In addition to processing the acquired baseband signals, processing circuitry 134 may also control aspects of radar front end circuit 132, such as the transmissions produced by radar front end circuit 132.

The various components of radar system 130 may be partitioned in various ways. For example, radar front end circuit 132 may be implemented on one or more RF integrated circuits (RFICs), antennas 142 and 144 may be disposed on a circuit board, and processing circuitry 134 may be implemented using a processor, a microprocessor, a digital signal processor and/or a custom logic circuit disposed on one or more integrated circuits/semiconductor substrates. Processing circuitry 134 may include a processor that executes instructions stored in a non-transitory memory to perform the functions of processing circuitry 134. In some embodiments, however, all or part of the functionality of processing circuitry 134 may be incorporated on the same integrated circuit/semiconductor substrate on which radar front end circuit 132 is disposed.

In some embodiments, some or all portions of radar front end circuit 132 may be implemented in a package that contains transmit antennas 142, receive antennas 144, transmitter front end circuits 138, receiver front end circuit 140, and/or radar circuitry 136. In some embodiments, radar front end circuit 132 may be implemented as one or more integrated circuits disposed on a circuit board, and transmit antennas 142 and receive antennas 144 may be implemented on the circuit board adjacent to the integrated circuits. In some embodiments, transmitter front end circuits 138, receiver front end circuit 140, and radar circuitry 136 are formed on a same radar front end integrated circuit (IC) die. Transmit antennas 142 and receive antennas 144 may be part of the radar front end IC die, or may be separate antennas over or adjacent to the radar front end IC die. The radar front end IC die may further include conductive layers, such as redistribution layers (RDLs), used for routing and/or for the implementation of various passive or active devices of radar front end circuit 132. In an embodiment, transmit antennas 142 and receive antennas 144 may be implemented using the RDLs of the radar front end IC die.

In various embodiments radar system 130 may be used to implement a gesture recognition system that is used to directly control a device such as a computer, a smartphone, or a tablet computer, or to control a remote device such as a vehicle, an electronic system within a building, or a home appliance. For example, when the remote device is a car, an embodiment gesture detection system allows a human actor to control various operations of the car from outside the car.

Figure 1D:
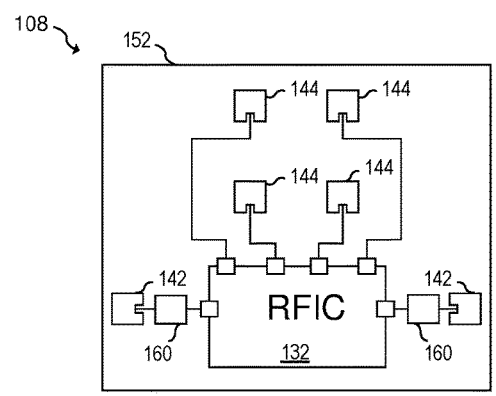
FIG. 1D illustrates a plan view of an active phase array assembly that includes a radar front end circuit implemented as a radio frequency integrated circuit and embodiment filters coupled between the radar front end circuit and antennas disposed on a substrate.

FIG. 1D illustrates a plan view of an active phased array assembly 108 that may be used to implement embodiment an active phased array communication system or radar system. As shown, RF front end circuit 132 implemented as an RFIC coupled to transmit antennas 142 and receive antennas 144 implemented as patch antennas disposed on or within substrate 152. In some embodiments, substrate 152 may be implemented using a circuit board on which RF front end circuit 132 is disposed and on which transmit antennas 142 and receive antennas 144 are implemented using conductive layers of the circuit board. Alternatively, substrate 152 represents a wafer substrate on which one or more RDLs are disposed and on which transmit antennas 142 and receive antennas 144 are implemented using conductive layers on the one or more RDLs.

Additionally, filters 160 are coupled between RF front end circuit 132 and transmit antennas 142. Filters 160 may be implemented as substrate integrated waveguide filters within substrate 152. In various alternative embodiments, more or fewer filters 160 may be included in the active phased array assembly 108. It should be appreciated that the implementation of FIG. 1D is just one of many ways that embodiment active phased array RF systems may be implemented.

RF signal filtering may be important for various applications that utilized active phased array RF transmission. For example, RF signal filtering may be useful if an active phased array radar system operates in a frequency range that is near occupied bands used by other collocated devices. RF signal filtering may also be useful when antennas in an active phased array system are used for radio frequency communications in addition to being used for radar. RF signal filtering may be implemented at some or all of the antennas within the active phased array system depending on specific design considerations and functionality.

In various embodiments, an active phased array module including an antenna array and one or more RFICs, is implemented with RF signal filtering at each antenna. The antenna array is located on one side of a multilayer printed circuit board (PCB) and the one or more RFICs are attached to the opposing side of the PCB. The radio frequency module further includes multiple substrate integrated waveguide (SIW) band-pass filters that are integrated within several layers of the PCB between the antenna array and the one or more RFICs. The active phased array module may provide facile and efficient RF signal filtering at each antenna.

Unwanted electromagnetic emissions outside the operating band of the active phased array module such as spurious emissions and out-of-band emissions may be reduced or eliminated by RF signal filtering using the SIW band-pass filters. The active phased array module may be designed to meet spurious emissions requirements to prevent incidental interference with other devices. For example, at 28 GHz, the RF signal filtering at each antenna in the active phased array module may meet recommendations provided by the International Telecommunications Union in ITU-R SM.329.

Each of the antennas is coupled to a corresponding SIW band-pass filter and is spaced from adjacent antennas by a uniform distance. This distance may be referred to as the lattice spacing of the antenna array and may be chosen based on the operating band of the active phased array module. Each of the SIW band-pass filters may be located beneath a corresponding antenna and fit within the lattice spacing of the antenna array. Such an arrangement may be used to reduce the size of the active phased array module while providing filtering of each antenna in the antenna array. Packaged components can be bulky compared to integrated components so space on the PCB may be limited for packaged components. The integration of the SIW band-pass filters within the PCB may free up space on the PCB that would otherwise be designated for filtering devices.

Embodiments provided below describe various structures of RF modules and RF device packages and various methods of fabricating RF modules and RF device packages, in particular, RF modules containing laminate substrates with multiple antenna elements and multiple filters integrated into the laminate substrates may have various advantages over conventional RF modules. The following description describes the various embodiments. An embodiment RF module is described using FIG. 2. Various embodiment RF device modules are described using FIGS. 3-9. An embodiment band-pass filter integrated into a substrate is described using FIGS. 10A and 10B. An embodiment RF module block diagram is described using FIG. 11. An embodiment RF module is described using FIG. 12. An alternative embodiment RF module block diagram is described using FIG. 13. A pair of alternative embodiment RF modules are described using FIGS. 14 and 15. An embodiment method of forming an RF module is described using FIG. 16. An embodiment method of operating an RF module is described using FIG. 17.

Figure 2:
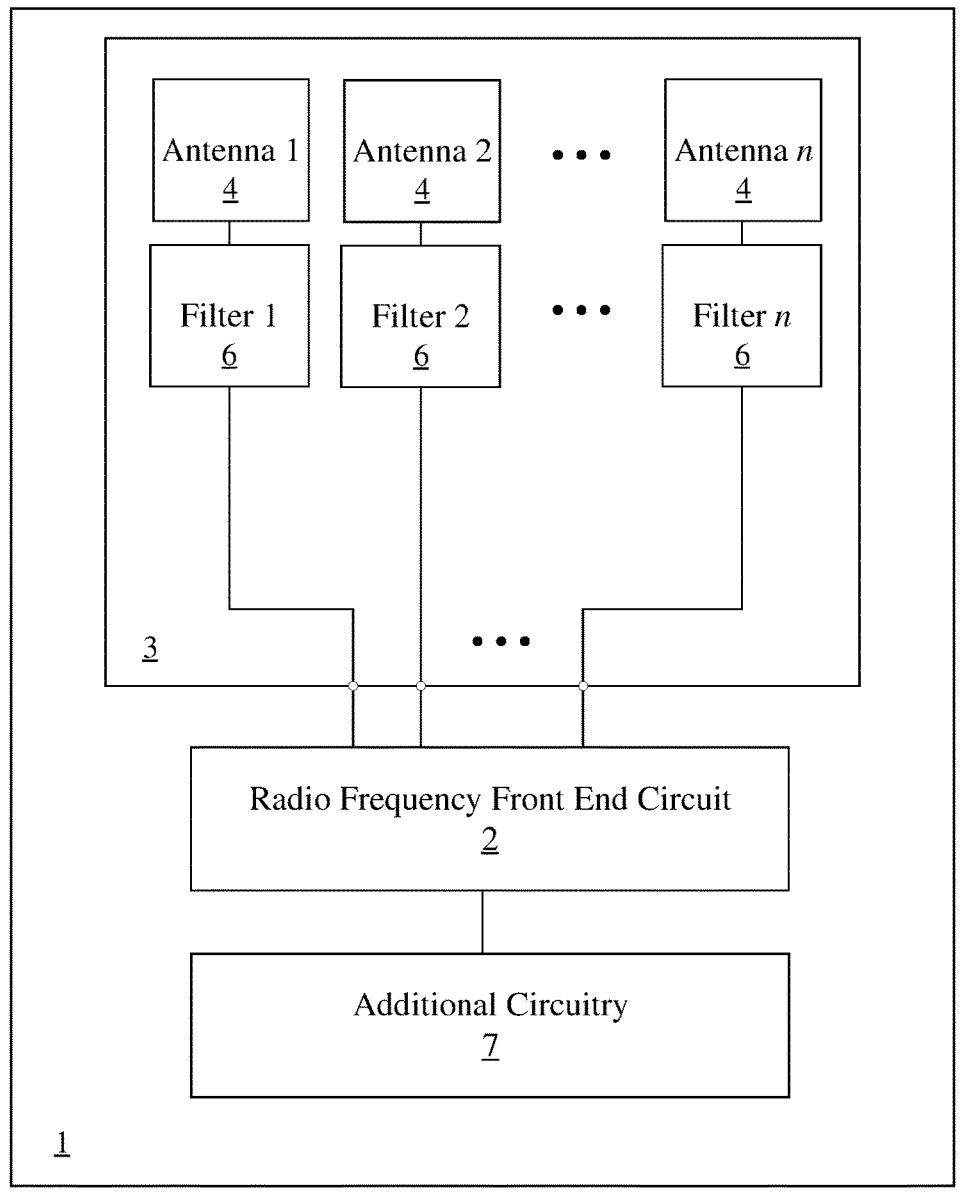
FIG. 2 illustrates a functional block diagram of a radio frequency module including multiple antennas and multiple filters in accordance with an embodiment of the invention.

FIG. 2 illustrates a functional block diagram of a radio frequency module including multiple antennas and multiple filters in accordance with an embodiment of the invention.

Referring to FIG. 2, a radio frequency module 1 includes an antenna substrate 3, a radio frequency front end circuit 2, and additional circuitry 7. The antenna substrate 3 includes one or more antennas 4 connected to one or more filters 6. Each of the antennas 4 may be configured to transmit and/or receive RF signals. For example, in various embodiments, some of the antennas 4 may be receiving antennas and some of the antennas 4 may be transmitting antennas. In other embodiments, one or more of the antennas 4 may be configured to both receive and transmit radio signals.

The radio frequency module 1 may be utilized for a radar applications, such as an automotive or gesture sensing application illustrated in FIG. 1C. Additionally, the radio frequency module 1 may be utilized in a communication application such as a 5G application, as illustrated in FIG. 1B, for example.

In various embodiments, each antenna 4 may be connected directly to a single filter 6. In other embodiments, any combination of antennas 4 and filters 6 may be implemented based on the specific functionality of the radio frequency module 1. As an example, specific functionality may be implemented by connecting each antenna 4 to a respective string of filters 6. Additionally, different antennas 4 in the same antenna substrate 3 may have different filtering functionality. For example, a subset of the antennas 4 may not perform filtering and consequently not be connected to any filters 6. Meanwhile, on the same antenna substrate 3, each antenna 4 of a different subset of antennas 4 may be connected to several filters 6. The number and configuration of the antennas 4 and filters 6 is not limited to a specific configuration and other configurations may be apparent to those of ordinary skill in the art.

Each of the filters 6 may modify an RF signal by allowing some frequencies to pass through the filter 6 while rejecting or attenuating other frequencies. In various embodiments, the filters 6 are analog filters. In one embodiment, the filters 6 are band-pass filters. Band-pass filters may allow a range of frequencies to pass through with little or no loss in signal power while rejecting or attenuating frequencies outside the range of frequencies. The range of frequencies that are passed through a given band-pass filter may be referred to as a passband. In various embodiments, the filters 6 are SIW filters and are SIW band-pass filters in one embodiment. In other embodiments, the filters 6 may include other types of filters such as low-pass filters, high-pass filters, and band-stop filters, for example.

In some embodiments, the filters 6 may include filters of different types and implementations depending on the design parameters of the radio frequency module 1. For example, the filters 6 may include both low-pass filters and high-pass filters. The filters 6 are not limited to a single type and other possible combinations of filters may be apparent to those of ordinary skill in the art.

A specific design consideration for filters such as filters 6 may be the order of the filter. Higher-order filters may increase the sharpness of the cutoff between passbands and stop bands. Possible trade-offs of higher-order filters may include ripples introduced in the passband, as well as increased size and complexity of the filter. As previously mentioned, size and cost of the filters 6 may be a significant consideration when designing a radio frequency module 1. The order of filters 6 may be chosen based on performance, size, and cost considerations.

The RF front end circuit 2 is configured to process radio signals and may include various circuit components such as frequency converters, power splitters/combiners, amplifiers, and phase shifters, for example. It should also be noted that the RF front end circuit 2 may include additional filters. Any additional filters included in the RF front end circuit 2 may be implemented as analog filters or digital filters.

The RF front end circuit 2 may be designed to operate in a super high frequency (SHF) or an extremely high frequency (EHF) regime. For example, the RF front end circuit 2 may contain millimeter wave (MMW) circuitry designed to operate in the 28 GHz regime (in 5G applications, for example). In various embodiments, the RF front end circuit 2 may contain MMW circuitry designed to operate in a frequency range between about 27.5 GHz and 300 GHz. Additionally or alternatively, the RF front end circuit 2 may contain MMW circuitry designed to operate in the unlicensed band from 57 GHz to 64 GHz.

The radio frequency front end circuit 2 is connected to filters 6 of the antenna substrate 3 using one or more connections. As shown in FIG. 2, module 1 has a connection from each of the filters 6 to the radio frequency front end circuit 2, but other connection schemes are possible. For example, a single connection between the RF front end circuit 2 and the antenna substrate 3 may be split into multiple connections within the antenna substrate 3 that connect to filters 6.

In some embodiments, the RF front end circuit 2 may also be connected to additional circuitry 7 located in the radio frequency module 1. The additional circuitry may include any type of circuitry such as a microcontroller unit (MCU), a digital signal processor (DSP), and/or a modem, for example. In other embodiments, the additional circuitry 7 may be omitted or implemented separate from the radio frequency module 1. Any combination of the RF front end circuit 2, the antenna substrate 3, and the additional circuitry 7 may be packaged together in a radio frequency device module. Various embodiments of a radio frequency device module are described in the following.

Figure 3:
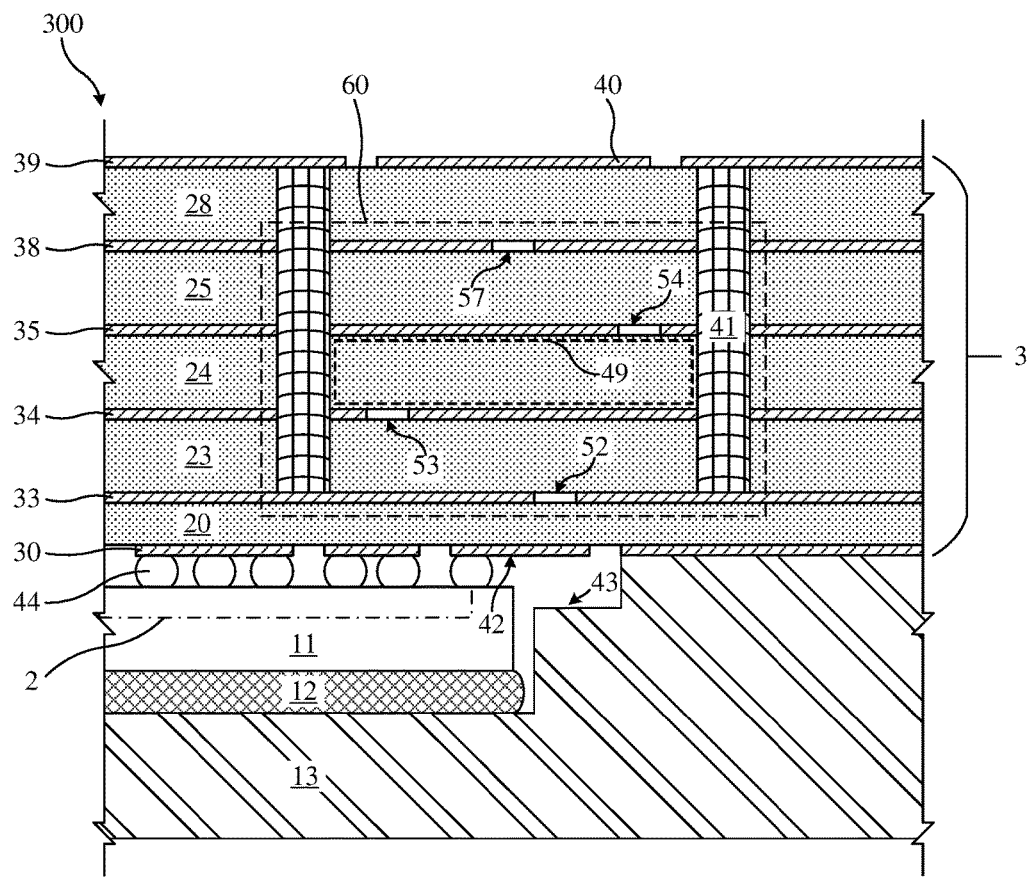
FIG. 3 illustrates a cross-sectional view of a portion of a radio frequency device module including an antenna, a substrate integrated waveguide band-pass filter, and a radio frequency integrated circuit chip in accordance with an embodiment of the invention.

FIG. 3 illustrates a cross-sectional view of portion of a radio frequency device module including an antenna, a substrate integrated waveguide band-pass filter, and a radio frequency integrated circuit chip in accordance with an embodiment of the invention.

Referring to FIG. 3, an RF device module 300 includes a RFIC chip 11. The RFIC chip 11 includes a semiconductor substrate. In one embodiment, the semiconductor substrate includes silicon. For example, the semiconductor substrate may be a silicon on insulator (SOI) such as silicon on silicon dioxide ($SiO_2$) or silicon on sapphire (SOS). In another embodiment, the semiconductor substrate includes silicon germanium (SiGe). In still another embodiment, the semiconductor substrate includes gallium arsenide (GaAs).

The RFIC chip 11 may include active and passive devices, metal layers, dielectric layers, doped and intrinsic semiconductor regions, and redistribution layers (RDLs) as well as other components known in the art. The RFIC chip 11 may have a receive interface connected to receiving antennas and/or a transmit interface connected to transmitting antennas. In some configurations, a receive interface and a transmit interface may be combined into a single interface.

In this and other embodiments, the RFIC chip 11 may be a packaged or unpackaged chip.

An RF front end circuit 2 may be integrated in the RFIC chip 11. The RF front end circuit 2 may be as described in previous embodiments. For example, the RF front end circuit 2 integrated in the RFIC chip 11 may be a specific implementation of an RF front end circuit in a radio frequency module as described in reference to FIG. 2.

Referring again to FIG. 3, the RF device module 300 also includes an antenna substrate 3. The RFIC chip 11 is disposed on a bottom surface of the antenna substrate 3. In various embodiments, the RFIC chip 11 has already undergone back end of line (BEOL) processing before being attached to the antenna substrate 3. The RFIC chip 11 may include one or more redistribution layers (RDLs) to redistribute connections to allow coupling to the conductive layer 30. The conductive layer 30 may also include a transmission line 42. The transmission line 42 may serve to couple the devices on the RFIC chip 11 to components of the antenna substrate 3. An electromagnetic signal may be propagated along the transmission line 42 between the RFIC chip 11 and the antenna substrate 3.

In various embodiments, the antenna substrate 3 may include a plurality of insulating and conductive layers such as conductive layer 30 disposed on a laminate layer 20. In various embodiments, the laminate layers include a low-loss high frequency material such as a woven glass reinforced hydrocarbon ceramic and/or polytetrafluoroethylene (PTFE). The antenna substrate 3 may include co-fired ceramic materials such as low temperature co-fired ceramics (LTCCs) or high temperature co-fire ceramics (HTCCs). Alternatively, the antenna substrate 3 may include liquid crystal polymer (LCP) materials. The material of the antenna substrate 3 is not limited to the examples given. Other possible materials may be apparent to those of ordinary skill in the art.

In one embodiment, the transmission line 42 is microstrip patterned into the conductive layer 30 as shown in FIG. 3. Alternatively, transmission line 42 may be implemented using stripline, a coplanar waveguide, or other suitable configuration. Transmission line 42 may be located in the interior of the RF device module 300 in a 3-dimensional package structure.

The conductive layer 30 may include a ground plane to reduce or prevent electromagnetic coupling between the RFIC chip 11 and subsequent layers disposed over the conductive layer 30. Various openings in the ground plane of the conductive layer 30 may be included to allow for redistribution lines and/or additional transmission lines in the conductive layer 30 that are electrically isolated from the ground plane. In this way, the conductive layer 30 may function as an RDL as well as a ground plane. Alternatively, the conductive layer 30 may include redistribution lines and/or transmission lines, but the ground plane may be omitted.

The RFIC chip 11 may be attached to the conductive layer 30 using connectors 44. The RFIC chip 11 may be oriented such that the connectors 44 make electrical contract with exposed regions of the conductive layer 30. In one embodiment, the connectors 44 may be solder balls that are part of a ball grid array (BGA) for embedded wafer level ball grid array (eWLB) packaging, for example. The solder balls may allow electrical coupling between circuitry on the RFIC chip 11 and the antenna substrate 3 such as ground planes, redistribution lines, and transmission lines, for example.

In various embodiments, the connectors 44 comprise a conductive material such as tin (Sn), silver (Ag), copper (Cu), zinc (Zn), and manganese (Mn). For example, the connectors 44 may be 18/64/14/4 Sn—Ag—Cu—Zn. Alternatively, the connectors 44 may be 18/64/16/2 Sn—Ag—Cu—Mn. However, these materials are merely examples. The connectors 44 may include any of a wide variety of solderable materials that are known in the art.

The RFIC chip 11 may be attached to the conductive layer 30 using well-known processes used with surface mount technology (SMT). For example, the RFIC chip 11 may be attached using a reflow soldering process during which the antenna substrate 3 may be subjected to controlled heat. The connectors 44 may directly attach to the conductive layer 30 disposed on a bottom surface of the laminate layer 20. The attachment of the RFIC chip 11 may also be accomplished using other well-known surface mounting techniques. For example, the connectors 44 may be conductive pillars. In various embodiments, the conductive pillars include a conductive material such as copper (Cu) or aluminum (Al).

The antenna substrate 3 may include multiple conductive layers. The conductive layer 30 is a specific example of a conductive layer. The conductive layers may be patterned to form ground planes, redistributions lines, transmission lines, and the like. In some embodiments, the conductive layers may be formed from a metal foil, metal layer, or metallization that has been laminated to a laminate layer. In one embodiment, the conductive layers include copper (Cu). In some embodiments, the conductive layers include other conductive materials such as silver (Ag) and aluminum (Al). In some embodiments, the conductive layers may include different conductive materials.

Still referring to FIG. 3, the laminate layer 20 may include a laminate material and in some embodiments is a prepreg material where fibers are pre-impregnated with a thermoplastic or a thermoset resin. In various embodiments, the first signal layer 20 may include a laminate material used for printed circuit board fabrication.

The antenna substrate 3 may also include multiple laminate layers separating conductive layers and providing structural support for the antenna substrate 3. Laminate layer 20 is a specific example of a laminate layer. In some embodiments, the laminate layers include a pre-impregnated composite material (PPG). In one embodiment, the laminate layers include FR-4 glass epoxy. In another embodiment, the laminate layers include a Rogers laminate material such as RO4003 or RO4350. In still another embodiment, the laminate layers include GHPL-970LF which is a prepreg material. Various laminate layers of the RF device module 300 may include different material depending on the desired functionality of each laminate layer. However, the antenna substrate 3 is not limited to laminate layer construction. The antenna substrate 3 may be implemented using any suitable multilayer substrate in various embodiments.

One or more of the laminate layers may be commercial laminate material manufactured with copper cladding on one or both surfaces. Sheets of copper clad laminate material may be fabricated as single-sided or double-sided copper clad sheets. During the fabrication process, copper sheets may be placed on one or both sides of the laminate material. Some combination of heat and pressure may then be applied to facilitate attachment of the copper sheets to the laminate material. It should be noted that in some cases it may be advantageous to use double-sided copper clad laminate material to form the laminate layers discussed previously and in future embodiments even when only a single conductive layer is needed. The unneeded conductive surface on the double-sided copper clad laminate is then etched off prior to lamination to a substrate. A possible benefit of etching a conductive layer off of a laminate material prior to lamination may be to improve adhesion to a substrate.

A conductive layer on a surface of a laminate layer may be an electrodeposited (ED) foil or a rolled foil, for example. A rolled foil sheet may be produced by repeatedly feeding the foil sheet through rollers to evenly reduce the thickness of the foil sheet. ED foil may be more rigid and have a different grain structure. In contrast, rolled foil may be smooth and flexible. In some cases, rolled foil may be advantageous in RF applications, due to decreased surface roughness.

Referring again to FIG. 3, the antenna substrate 3 further includes a SIW band-pass filter 60 composed of multiple conductive layers and one or more laminate layers. As shown in FIG. 3, an alternating stack of conductive layers 33, 34, 35, 38 and laminate layers 23, 24, 25 is disposed on laminate layer 20 to form the SIW band-pass filter 60. Vias 41 extend through some or all of the layers of the SIW band-pass filter 60 to form waveguide cavities 49 in conjunction with conductive layers 33, 34, 35, 38. In some embodiments, the laminate layers 23, 24, 25 may fill the waveguide cavities 49 for form dielectric-filled waveguides. Alternatively, one or all of the waveguide cavities 49 of the SIW band-pass filter 60 may be hollowed out and filled with a different material such as air, for example.

The conductive layers 33, 34, 35, 38 may be patterned to function as a ground plane in at least the region between the vias 41. The vias 41 may make electrical contact with the conductive layers 33, 34, 35, 38 to maintain a constant reference potential on the top and bottom surfaces of each of the waveguide cavities 49 as well as the vias 41 themselves. The dimensions of the waveguide cavities 49 may be determined by the desired passband of the SIW band-pass filter.

A coupling slot 52 is patterned into the conductive layer 33 in the region between the vias 41. The coupling slot 52 may serve to electromagnetically couple the SIW band-pass filter 600 with transmission line 42. Coupling slots 53 and 54 are patterned into conductive layers 34 and 35 respectively. The coupling slots 53, 54 electromagnetically couple adjacent waveguide cavities 49 in the SIW band-pass filter 60. It should be noted that for reasons of clarity, only one waveguide cavity 49 has been labeled in FIG. 3 and in subsequent Figures. Coupling slot 57 is patterned into conductive layer 38 and similarly serves to electromagnetically couple the SIW band-pass filter 60 to additional components and/or transmission lines in the antenna substrate 3 such as antenna 40 which is subsequently described.

Electromagnetic coupling may also be referred to as indirect coupling. The coupling slots 52, 53, 54, 57 may restrict electromagnetic signals to a defined area. Electromagnetic signals that are incident on ground plane portions of the conductive layers 33, 34, 35, 38 may be dissipated by a ground connection. Slots may also be referred to as apertures and this type of electromagnetic coupling may be referred to as aperture coupling. In one embodiment, the SIW band-pass filter 600 is coupled to the transmission line 42 using aperture coupling. More or fewer slots may also be included in the ground plane.

The order of SIW band-pass filter 600 may be determined by the number of waveguide cavities 49 integrated into the antenna substrate 3. For example, the SIW band-pass filter 60 illustrated in FIG. 3 has three waveguide cavities 49 and is a third-order SIW band-pass filter.

Figure 9:
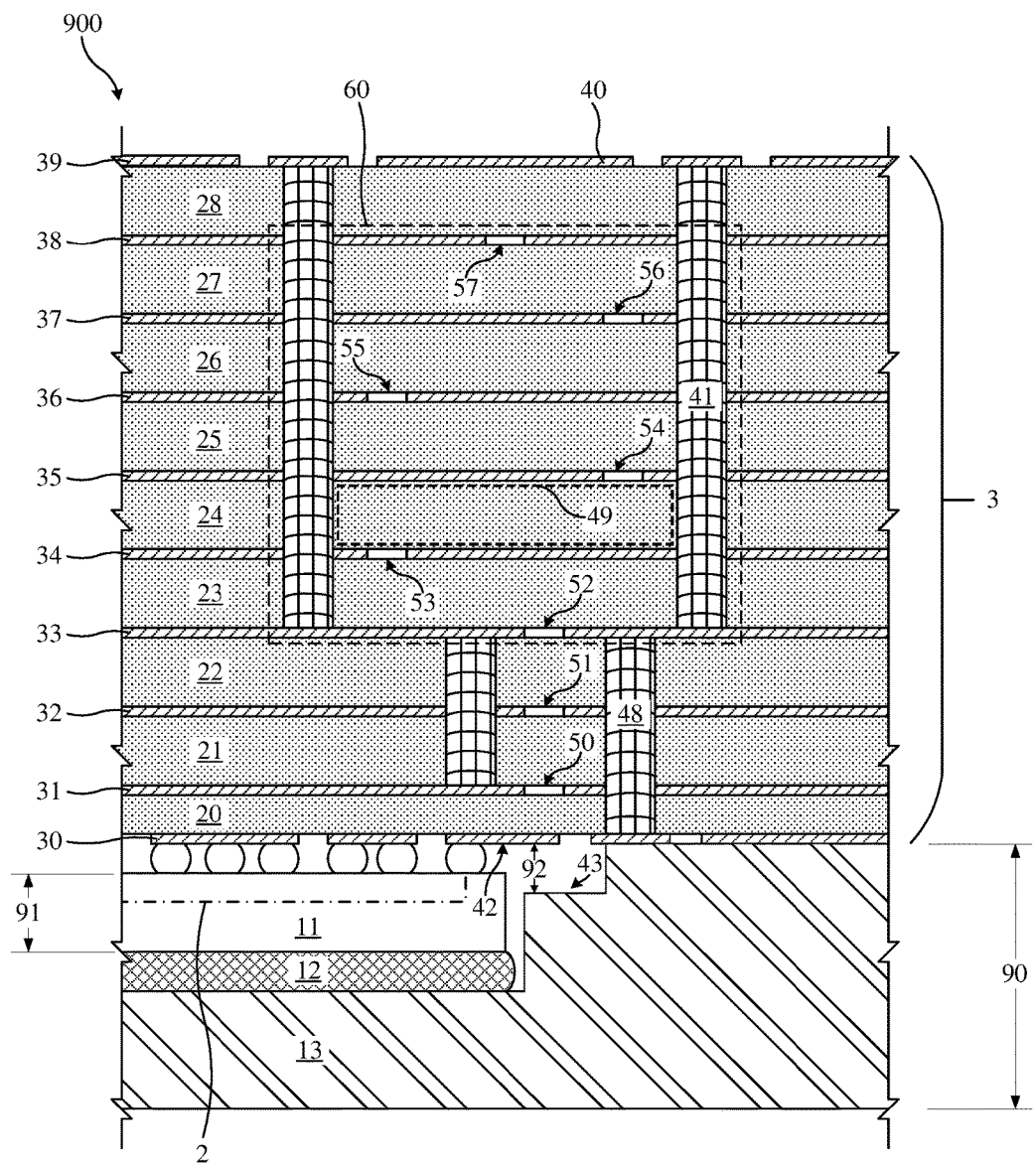
FIG. 9 illustrates a cross-sectional view of a portion of a radio frequency device module including an antenna, a fifth order substrate integrated waveguide band-pass filter, a radio frequency integrated circuit chip, and indirect coupling of the radio frequency integrated circuit chip to the substrate integrated waveguide band-pass filter through multiple signal layers in accordance with an embodiment of the invention.

It should be understood that RF device module 300 is not limited to a particular order of SIW band-pass filter. For example, fewer layers may be used to form a lower-order SIW band-pass filter such as a second-order SIW band-pass filter. Alternatively, more layers may be incorporated to form a higher-order SIW band-pass filter such as a fifth-order SIW band-pass filter. An embodiment fifth-order SIW band-pass filter is illustrated in FIG. 9. Additionally, SIW band-pass filters of different order may be present in the same antenna substrate 3. There is no requirement that all SIW band-pass filters in the antenna substrate 3 are of the same order.

The cross-sectional view illustrated in FIG. 3 shows only one via 41 on each side of the of the SIW band-pass filter 60. However, the SIW band-pass filters 60 may be 3-dimensional devices with waveguide cavities 49 extending into and out of the plane of the drawing. Vias 41 may be arranged along the perimeter of the SIW band-pass filter 60 in order to surround or partially surround the SIW band-pass filter 60 to form the waveguide cavities 49. Such a possible configuration is illustrated in FIG. 10A.

Still referring to FIG. 3, a laminate layer 28 is disposed on the conductive layer 38. A conductive layer 39 is disposed on the laminate layer 28. In one embodiment, the conductive layer 39 is on a top surface of the antenna substrate 3. The top surface of the antenna substrate 3 may also be a top surface of the RF device module 300. The conductive layer 39 may be patterned to include an antenna 40. The antenna 40 is a planar antenna in various embodiments and is a patch antenna in one embodiment. In other embodiments, the antenna 40 may be another type of planar antenna such as slot, ring, spiral, and bow-tie antenna configurations, a tapered slot antenna (TSA), a Vivaldi antenna, a log periodic dipole antenna (LPDA), a Yagi-Uda antenna, a quasi-Yagi antenna, a leaky wave antenna (LWA), or the like. In one embodiment, the antenna 40 may be configured to radiate electromagnetic radiation in a direction perpendicular to the surface of the antenna substrate 3. In other embodiments, antenna 40 may be configured to radiate in other directions. There is no limitation that all antennas 40 on the antenna substrate radiate in the same direction.

The antenna 40 may include a conductive material in various embodiments. For example, in one embodiment, the antenna 40 includes copper (Cu). Antennas 40 made from different conductive materials may be present in the same RF device module 300 in some embodiments.

In one embodiment, the coupling slot 56 serves to electromagnetically couple the SIW band-pass filter 60 the antenna 40. It should be noted that the combination of the vias 41 and conductive layers 38 and 39 forms a waveguide cavity 49 that may not be considered part of the SIW band-pass filter 60. Waveguide cavities 49 may be present in the antenna substrate 3 outside of the SIW band-pass filter 60 to guide electromagnetic signals between components and within other components.

In FIG. 3, the lateral extent of the antenna 40 is depicted as being smaller than the lateral extent of the SIW band-pass filter 60. However, this is not required to be the case. In some embodiments the lateral extent of the antenna 40 may be larger than that of the SIW band-pass filter 60. Additionally, some lateral dimensions of the antenna 40 may be smaller than the SIW band-pass filter 60 while others might be larger. Such a configuration is shown as an example in the RF modules illustrated in FIGS. 12, 14, and 15.

In various embodiments, the antenna 40 may be surrounded or partially surrounded by the vias 41. The vias 41 may extend from the conductive layer 39 into the antenna substrate 3. In various embodiments, the vias 41 may advantageously electromagnetically and/or electrostatically isolate the antenna 40 from other regions of the antenna substrate 3. For example, the vias 41 may act as a shielding wall to suppress or eliminate the effects of mutual coupling between antenna elements, spurious modes, parallel plate modes, and/or higher-order modes generated in other transmission lines and antenna elements. It is possible for the vias surrounding the SIW band-pass filter 60 and the antenna 40 to be implemented as separate sets of vias. Such a configuration may be used if the shape or size SIW band-pass filter 60 and the antenna 40 are sufficiently different. The vias 41 may also terminate at conductive layer 38 and consequently not surrounded the antenna 40.

A cover 13 is optionally disposed over a bottom surface of the combined structure of the RFIC chip 11 and the antenna substrate 3. The cover 13 may include a thermally conductive material and function as a heatsink for the RF device module 300. A thermally conductive layer 12 may optionally be disposed between the RFIC chip 11 and the cover 13. The thermally conductive layer 12 may facilitate improved heat transfer from the RFIC chip 11 to the cover 13.

In various embodiments, the cover 13 may include a conductive material and contain a specifically shaped volume that functions as a back short 43 for RF signals transmitted from the RFIC chip 11 to the antenna substrate 3 through transmission line 42. The back short 43 may be positioned below a region of electromagnetic coupling in the antenna substrate 3. The dimensions of the back short 43 may be determined by the frequency range of the signals transmitted in transmission line 42.

The RF device module 300 may extend further in either lateral direction as illustrated in FIG. 3 and may contain additional components such as integrated circuit chips, discrete circuit components, back shorts, antennas, contact pads, filters, vias, redistribution lines, transmission lines, and the like.

Some or all of the antennas, filters, and ground planes in the RF device module 300 may be located directly over the RFIC chip 11. A possible benefit of this complete integration of the filter and antenna elements into the packaging of the RFIC chip 11 is to reduce the overall size of the package while still providing filtering at each antenna.

Figure 4:
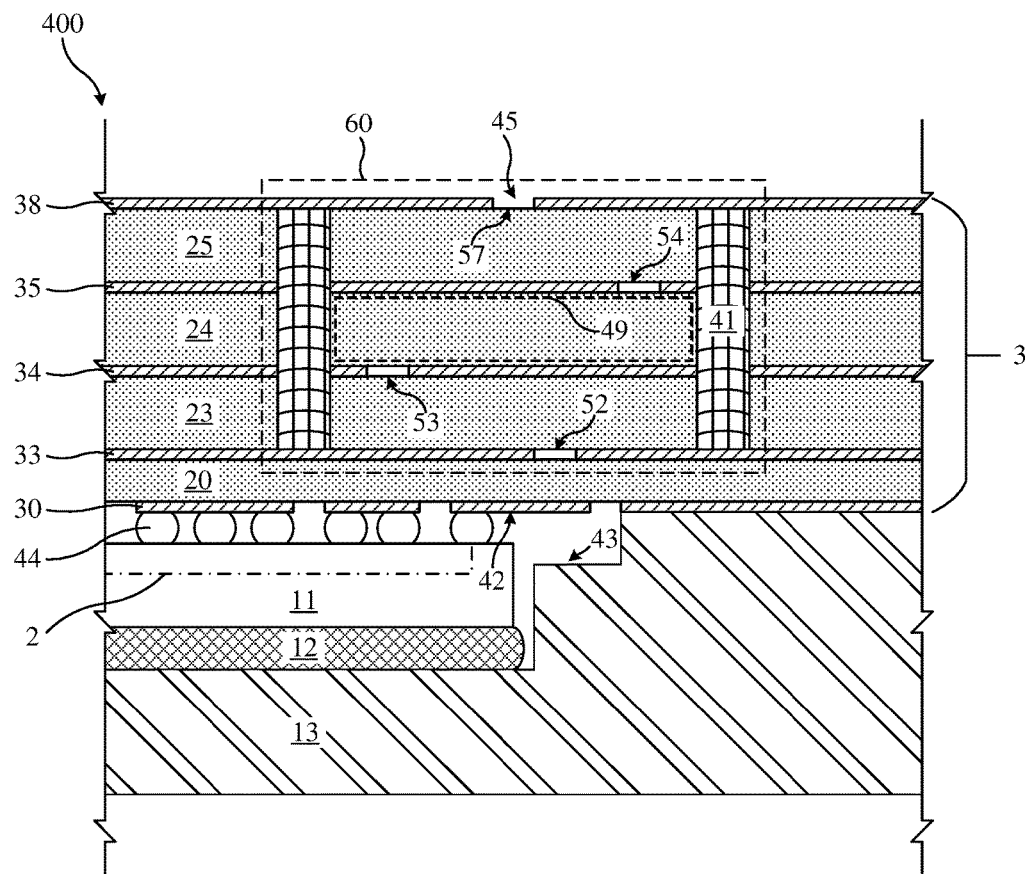
FIG. 4 illustrates a cross-sectional view of a portion of a radio frequency device module including a slot antenna, a substrate integrated waveguide band-pass filter, and a radio frequency integrated circuit chip in accordance with an embodiment of the invention.

FIG. 4 illustrates a cross-sectional view of a portion of a radio frequency device module including a slot antenna, a substrate integrated waveguide band-pass filter, and a radio frequency integrated circuit chip in accordance with an embodiment of the invention.

Referring to FIG. 4, an RF device module 400 includes a RFIC chip 11 disposed on a bottom surface of an antenna substrate 3 as previously described. Like elements of the RF device module 400 and the RF device module 300 are labeled using like numerical references and are as previously described. Specific description of such features has not been repeated here for reasons of brevity. A conductive layer 38 is at a top surface of the antenna substrate 3 and a slot antenna 45 is disposed in conductive layer 38. The slot antenna 45 is formed from the coupling slot 57 and is coupled to the SIW band-pass filter 60 through the coupling slot 57. In this configuration, the coupling slot 57 may be the radiative element of the slot antenna 45.

A possible benefit of implementing the slot antenna 45 by using the coupling slot 57 as a radiative element may be to improve antenna efficiency. Additional advantages may be to reduce the number of layers in the antenna substrate 3 to reduce size and/or cost.

Figure 5:
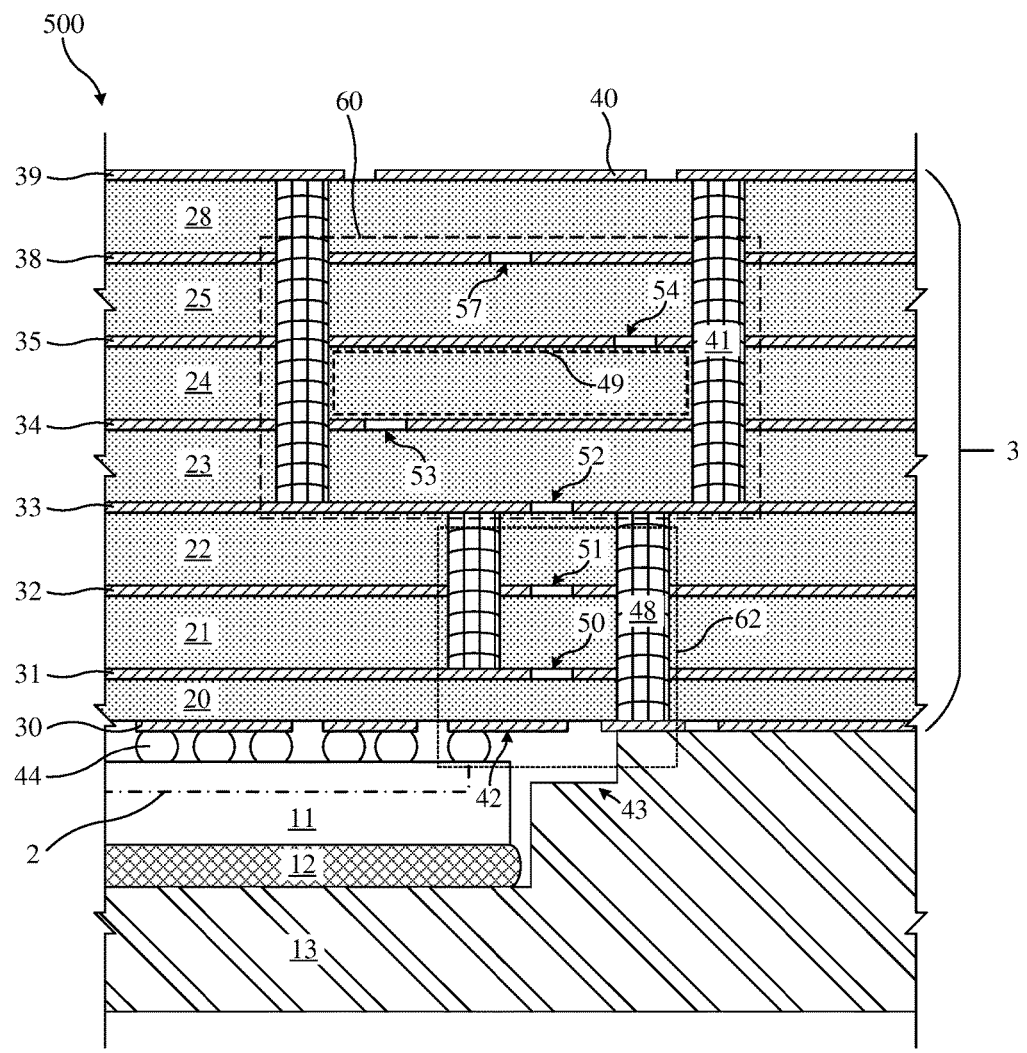
FIG. 5 illustrates a cross-sectional view of a portion of a radio frequency device module including an antenna, a substrate integrated waveguide band-pass filter, a radio frequency integrated circuit chip, and indirect coupling of the radio frequency integrated circuit chip to the substrate integrated waveguide band-pass filter through multiple signal layers in accordance with an embodiment of the invention.

FIG. 5 illustrates a cross-sectional view of a portion of a radio frequency device module including an antenna, a substrate integrated waveguide band-pass filter, a radio frequency integrated circuit chip, and indirect coupling of the radio frequency integrated circuit chip to the substrate integrated waveguide band-pass filter through multiple signal layers in accordance with an embodiment of the invention.

Referring to FIG. 5, an RF device module 500 includes a RFIC chip 11 disposed on a bottom surface of an antenna substrate 3 as previously described. Like elements of the RF device module 500 and the RF device module 300 are labeled using like numerical references and are as previously described. Specific description of such features has not been repeated here for reasons of brevity.

The RF device module 500 includes conductive layers 31 and 32 and laminate layers 21 and 22. The conductive layers 31, 32 and laminate layers 21, 22 are disposed between laminate layer 20 and conductive layer 33 in the antenna substrate 3. The inclusion of additional conductive and laminate layers may allow for additional routing of direct current (DC) and intermediate frequency (IF) signaling.

Transmission line 42 may be coupled to the SIW band-pass filter 600 through conductive layers 31, 32 and laminate layers 21, 22 using coupling slots 50 and 51. In one embodiment, the coupling of the transmission line 42 to the SIW band-pass filter 600 is implemented using aperture coupling. The combination of conductive layers 31, 32, laminate layers 21, 22 and coupling slots 50, 51 may be referred to as an interface structure 62. The interface structure 62 and transmission line 42 may serve to couple the RFIC chip 11 or other suitable structure to the SIW band-pass filter 60. The coupling slots 50 and 51 may be patterned in conductive layers 31 and 32 respectively. Vias 48 may be included to form a waveguide cavity to direct RF signals vertically through the conductive layers 31, 32, and laminate layers 21, 22.

Figure 6:
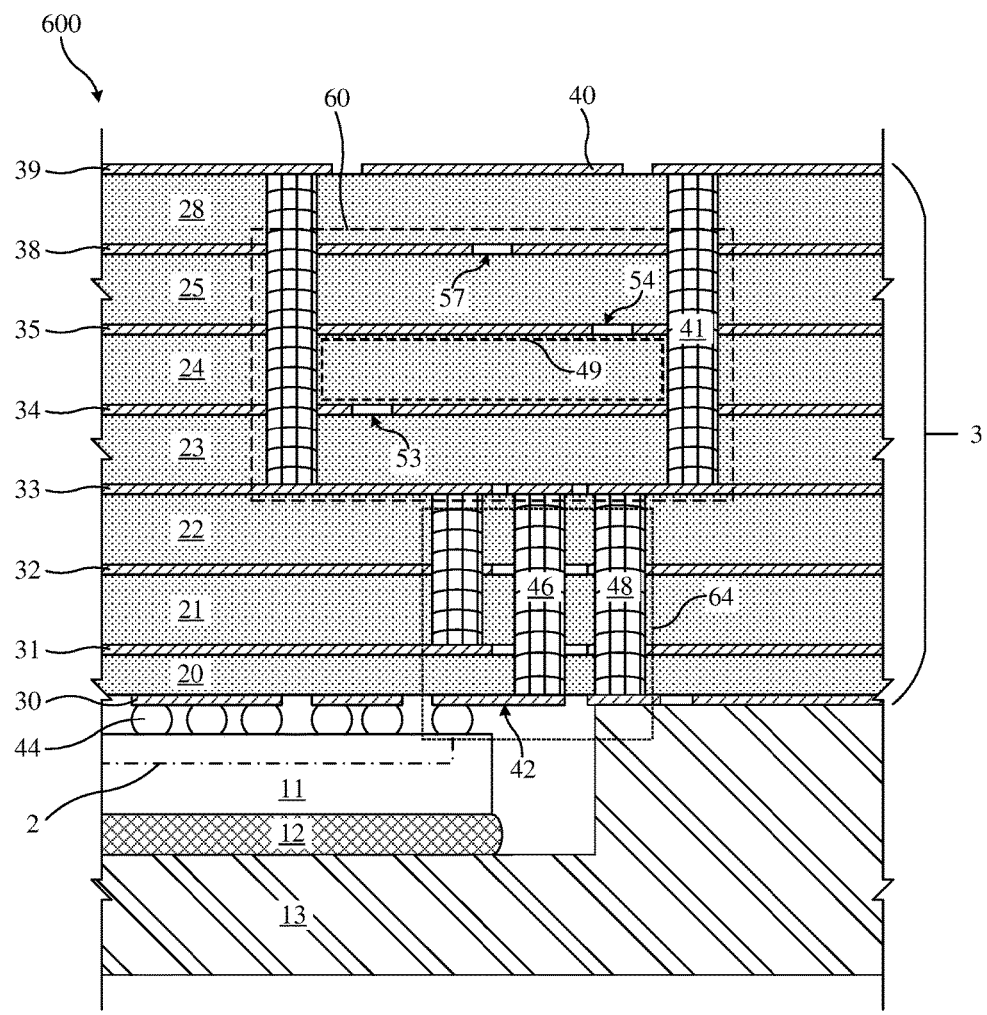
FIG. 6 illustrates a cross-sectional view of a portion of a radio frequency device module including an antenna, a substrate integrated waveguide band-pass filter, a radio frequency integrated circuit chip, and direct coupling of the radio frequency integrated circuit chip to the substrate integrated waveguide band-pass filter through multiple signal layers in accordance with an embodiment of the invention.

FIG. 6 illustrates a cross-sectional view of a portion of a radio frequency device module including an antenna, a substrate integrated waveguide band-pass filter, a radio frequency integrated circuit chip, and direct coupling of the radio frequency integrated circuit chip to the substrate integrated waveguide band-pass filter through multiple signal layers in accordance with an embodiment of the invention.

Referring to FIG. 6, an RF device module 600 includes a RFIC chip 11 disposed on a bottom surface of an antenna substrate 3 as previously described. Like elements of the RF device module 600 and RF device modules 300 and 500 are labeled using like numerical references and are as previously described. Specific description of such features has not been repeated here for reasons of brevity.

The RF device module 600 includes a transmission via 46 extending from transmission line 42 through conductive layers 31, 32 and laminate layers 21, 22 and terminating at conductive layer 33. The transmission via 46 may serve to provide electrical coupling between the transmission line 42 and the SIW band-pass filter 60. In one embodiment, the transmission via 46 is at least partially surrounded by vias 48. Vias 48 may be connected to a reference potential such as a ground potential and may serve to shield transmission via 46. The combination of vias 48, conductive layers 31, 32, laminate layers 21, 22, and transmission via 46 may be referred to as an interface structure 64. In the case of electrical coupling, RF signals may be transferred between components by direct electrical conduction. Electrical coupling may also be referred to as direct coupling. In one embodiment, the transmission via 46 provides electrical coupling between the transmission line 42 and the SIW band-pass filter 60 using via coupling. It should be noted that in the case of direct coupling, a back short may not be needed in the cover 13.

Figure 7:
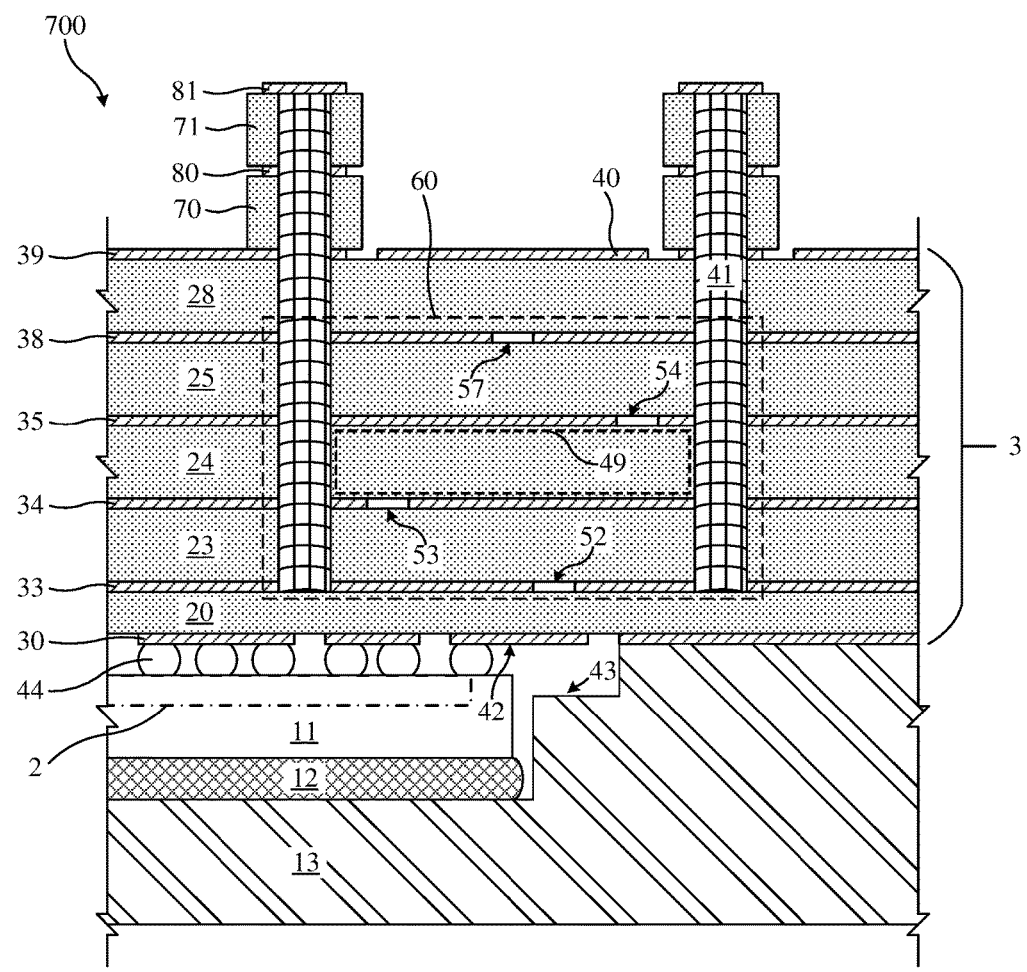
FIG. 7 illustrates a cross-sectional view of a portion of a radio frequency device module including an antenna, a substrate integrated waveguide band-pass filter, a radio frequency integrated circuit chip, and vias extending above an outer surface of an antenna layer of the substrate in accordance with an embodiment of the invention.

FIG. 7 illustrates a cross-sectional view of a portion of a radio frequency device module including an antenna, a substrate integrated waveguide band-pass filter, a radio frequency integrated circuit chip, and vias extending above an outer surface of an antenna layer of the substrate in accordance with an embodiment of the invention.

Referring to FIG. 7, an RF device module 700 includes a RFIC chip 11 disposed on a bottom surface of an antenna substrate 3 as previously described. Like elements of the RF device module 700 and the RF device module 300 are labeled using like numerical references and are as previously described. Specific description of such features has not been repeated here for reasons of brevity.

The RF device module 700 includes conductive layers 80 and 81 and laminate layers 70 and 71. The conductive layers 80, 81 and laminate layers 70, 71 are disposed on a top surface of the antenna substrate 3. The vias 41 may extend upward from the top surface through conductive layer 80 and laminate layers 70, 71 and terminate at conductive layer 81. Conductive layers 80, 81 and laminate layers 70, 71 may be patterned to expose the top surface of the antenna substrate 3. For example, the conductive layers 80, 81 and laminate layers 70, 71 may be subsequently etched or milled out exposing the top surface of antenna substrate 3. In this way, the top surface of the antenna substrate may become an outer surface of the RF device module 700. The extension of vias 41 above the top surface of the antenna substrate 3 may serve to further isolate the antenna 40 from other components on antenna substrate 3 and also shape the radiation pattern of antenna 40.

More or fewer conductive layers and laminate layers may be included depending on the desired radiation pattern and desired levels of isolation of the antenna 40. Other antennas on the antenna substrate 3 may have the same or different configurations depending on design parameters.

Figure 8:
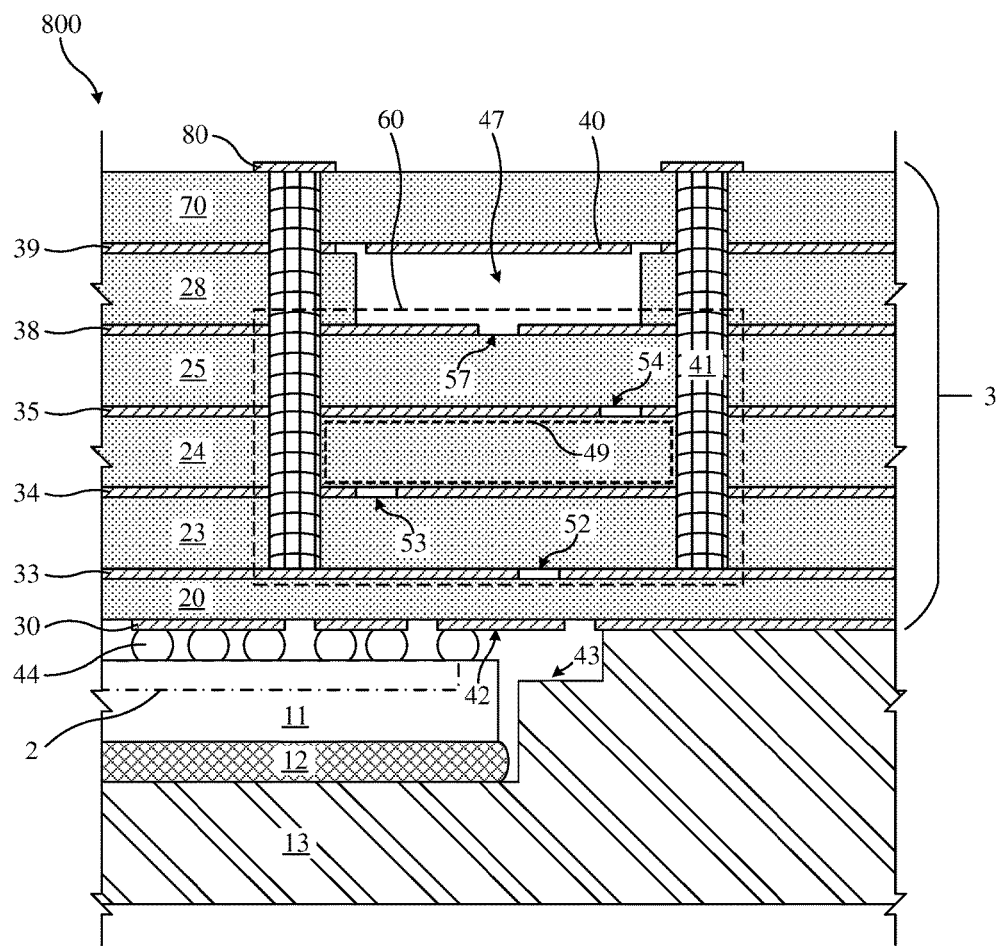
FIG. 8 illustrates a cross-sectional view of a portion of a radio frequency device module including an antenna, a substrate integrated waveguide band-pass filter, a radio frequency integrated circuit chip, and a cavity within the substrate between the antenna and the substrate integrated waveguide band-pass filter in accordance with an embodiment of the invention.

FIG. 8 illustrates a cross-sectional view of a portion of a radio frequency device module including an antenna, a substrate integrated waveguide band-pass filter, a radio frequency integrated circuit chip, and a cavity within the substrate between the antenna and the substrate integrated waveguide band-pass filter in accordance with an embodiment of the invention.

Referring to FIG. 8, an RF device module 800 includes a RFIC chip 11 disposed on a bottom surface of an antenna substrate 3 as previously described. Like elements of the RF device module 800 and the RF device module 30000 are labeled using like numerical references and are as previously described. Specific description of such features has not been repeated here for reasons of brevity.

The RF device module 800 includes a conductive layer 80, a laminate layer 70, and an antenna cavity 47 in laminate layer 28. The antenna cavity 47 may serve to increase the bandwidth and/or radiation efficiency of the antenna 40.

In various embodiments, the antenna cavity 47 is filled with an insulating material and, in some embodiments, is filled with an insulating material in a gaseous state. In some embodiments, the insulating material is a dielectric material. In one embodiment, the dielectric material in a gaseous state is air. Other dielectric materials may be solids, gels, liquids, or gases and may be chosen based on the desired functionality of the antenna 40. Other antennas on the antenna substrate 3 may or may not have air cavities depending on the individual functionality of each antenna.

FIG. 9 illustrates a cross-sectional view of a portion of a radio frequency device module including an antenna, a fifth order substrate integrated waveguide band-pass filter, a radio frequency integrated circuit chip, and indirect coupling of the radio frequency integrated circuit chip to the substrate integrated waveguide band-pass filter through multiple signal layers in accordance with an embodiment of the invention.

Referring to FIG. 9, an RF device module 900 includes a RFIC chip 11 disposed on a bottom surface of an antenna substrate 3 as previously described. Like elements of the RF device module 900 and RF device modules 30000 and 500 are labeled using like numerical references and are as previously described. Specific description of such features has not been repeated here for reasons of brevity.

The RF device module 900 includes conductive layers 36 and 37 and laminate layers 26 and 27. The conductive layers 36, 37 and laminate layers 26, 27 are disposed between laminate layer 26 and conductive layer 38 in antenna substrate 3. Coupling slots 55 and 56 may be patterned into conductive layers 36, and 37 respectively. The conductive layers 36, 37 and laminate layers 26, 27 may increase the order of the SIW band-pass filter 60 in comparison to previous embodiments. For example, the SIW band-pass filter 60 as illustrated in FIG. 9 includes five waveguide cavities 49 and is a fifth-order SIW band-pass filter.

It should be noted that the RF device module 900, as shown in FIG. 9, includes an interface structure between the transmission line 42 and the SIW band-pass filter 60. The interface structure is not labeled in FIG. 9 for reasons of clarity, and may be as previously described in reference to FIG. 4. In one embodiment, the interface structure couples the transmission line 42 to the SIW band-pass filter 60 using aperture coupling. Alternatively, the interface structure may provide direct coupling and be as previously described in reference to FIG. 5. For example, in an alternative embodiment, the interface structure may couple the transmission line 42 to the SIW band-pass filter 60 using via coupling.

For reference purposes, FIG. 9 also shows representative dimensions of the RF device module 900. These dimensions may also describe possible dimensions of similar features in other embodiments where applicable.

The cover 13 has a cover thickness 900 as measured from a bottom surface of the antenna substrate 3 that is between about 2 and about 15 mm in various embodiments. In one embodiment, the cover thickness 900 is about 5 mm. In another embodiment, the cover thickness 900 is about 7.5 mm. In still another embodiment, the cover thickness 900 is about 10 mm. The cover thickness 900 may be determined by considering protection, heat dissipation, and size considerations of the RF device module 900.

The RFIC chip 11 has an RFIC chip thickness 91 that is between about 0.5 mm and about 1 mm in various embodiments. In one embodiment, the RFIC chip thickness 91 is about 0.8 mm.

The back short 43 has a back short depth 92 that is between about 0.5 mm and about 5 mm in various embodiments. In one embodiment, the back short depth 92 is about 1 mm. In another embodiment, the back short depth 92 is about 2 mm. In still another embodiment, the back short depth 92 is about 4 mm. The back short depth 92 for any transmission line 42 may depend on the frequency of the signals transmitted in the transmission line 42.

Various features from the RF device modules illustrated in FIGS. 3-9 such as patch antennas, slot antennas, direct coupling, indirect coupling, additional routing layers, extended via isolation of antennas, antenna cavities, and higher-order SIW band-pass filters may be combined in any configuration in an RF device module. It should be appreciated that not all possible combinations of features are illustrated together because of the large number of possible combinations. However, the possible configurations are not limited to the illustrated combinations and additional combinations may be apparent to those of ordinary skill in the art.

The RF device modules described using FIGS. 3-9 may be specific implementations of a radio frequency module as described in other embodiments. Alternatively, the RF device module may be one component in a radio frequency module that contains additional components packaged into a radio frequency module as described in other embodiments.

FIGS. 10A and 10B illustrate a substrate integrated waveguide band-pass filter in accordance with an embodiment of the invention, where FIG. 10A illustrates a top view of the substrate integrated waveguide band-pass filter, and FIG. 10B illustrates a cross-sectional view of the substrate integrated waveguide band-pass filter along a 10B-10B line in FIG. 10A. The SIW band-pass filter may be a specific implementation of a filter or an SIW band-pass filter as previously described in reference to FIGS. 2-9.

Referring to FIGS. 10A and 10B, a SIW band-pass filter 60 includes coupling slots 52, 53, 54, and 58 disposed in conductive layers 33, 34, 35, and 38 of a substrate 29. Vias 41 surround the coupling slots 53, 54, 58, 59 to form waveguide cavities 49 in laminate layers 23, 24, and 25. The laminate layers 23, 24, 25, the conductive layers 33, 34, 35, 38, the coupling slots 53, 54, and vias 41 are as previously described. Transmission lines 42 are disposed above and below substrate 29 and are coupled to the SIW band-pass filter 60 using coupling slots 52 and 58.

The shape of the couplings slots 52, 53, 54, 58 when viewed from above is rectangular in one embodiment. However, any shape is possible and may depend on operational parameters of the SIW band-pass filter 60. For example, the shape of the coupling slots 52, 53, 54, 58 may be substantially circular, substantially elliptical, or substantially square. Other shapes may be apparent to those of ordinary skill in the art. In various embodiments, the coupling slots 52, 53, 54, 58 may alternate between lateral positions such that some coupling slots are vertically aligned with other coupling slots. For example, as shown in FIGS. 10A and 10B, coupling slots 52 and 54 are substantially vertically aligned, and coupling slots 53 and 58 are substantially vertically aligned.

Similarly, the shape of the waveguide cavities 49 when viewed from above are rectangular in one embodiment, but may also be any shape as needed to produce desired functionality of the SIW band-pass filter 60. A possible advantage of rectangular waveguide cavities is to make use of the $TE_{101}$ cavity mode. As previously mentioned in reference to FIGS. 3-9, the vias 41 may surround the coupling slots 52, 53, 54, 58, and the waveguide cavities 49 of the SIW band-pass filter 600 in one embodiment. In other embodiments, the vias 41 may only partially surround the coupling slots 52, 53, 54, 58, and the waveguide cavities 49.

The vias 41 may be positioned such that RF signals inside the SIW band-pass filter 60 are reflected by the vias 41 and remain inside the SIW band-pass filter 60. Signals outside the SIW band-pass filter 60 may also be reflected by the vias 41 which may also serve to electrostatically isolate the SIW band-pass filter 60 as described previous in reference to FIGS. 3-9.

The implementation of the waveguide cavities 49 are not limited to vias 41 and may depend on types of materials, substrates, and fabrication methods as well as design parameters of the SIW band-pass filter 60. In some embodiments, other conductive structures may be used to form the waveguide cavities 49 of the SIW band-pass filter 60. For example, the vias 41 may be replaced by patterned structures such as conductive pillars or metal walls. Other alternative structures may be apparent to those of ordinary skill in the art.

For reference purposes, in FIGS. 10A and 10B representative dimensions of the SIW band-pass filter 600 have been labeled. These dimensions may also describe dimensions of similar features in other embodiments where applicable. Other additional dimensions may be determined from the scale bars as illustrated.

The coupling slot 52 has a coupling slot width 93 that is between about 0.125 mm and about 0.5 mm in various embodiments. In one embodiment, the coupling slot width 93 is about 0.25 mm. Similarly, the coupling slot 52 also has a coupling slot length 94 that is between about 1.5 mm and about 2.5 mm in various embodiments. In one embodiment, the coupling slot length 94 is about 1.8 mm. It should be noted that in this specific embodiment, coupling slots 53 and 54 have different dimensions that coupling slots 52 and 58. This may also not be the case. In other embodiments any coupling slot may be any size as determined by the specific functionality of the SIW band-pass filter 60.

The waveguide cavities 49 have a waveguide cavity width 95 as measured from the center of the vias 41 on opposite sides of the waveguide cavities 49 that is between about 3.5 mm and about 4.5 mm in various embodiments. In one embodiment, the waveguide cavity width 95 is about 3.9 mm. The waveguide cavity width 95 may be chosen according to the frequency or range of frequencies of the signals that are filtered by the SIW band-pass filter 60.

The laminate layer 23 has a layer thickness 96 that is between about 0.25 mm and about 0.5 mm in various embodiments. On one embodiment, the layer thickness 96 is about 0.3 mm. Laminate layers 24 and 25 may have the same thickness as laminate layer 23 or a different thickness. The vertical thickness of the laminate layers 23, 24, and 25 may be chosen to optimize transmission line properties in the SIW band-pass filter 60.

A possible advantage of the SIW band-pass filter 60 is to enable cost efficient filtering of individual antenna elements when implemented into a radio frequency module containing an array of antenna elements. The SIW band-pass filter 60 may advantageously fit into the array lattice (spacing between antenna elements) due to the multilayer vertical nature of the SIW band-pass filter 60. For example, the size of the waveguide cavities 49 may depend on the wavelength of the passband for the SIW band-pass filter 60 as previously discussed whereas the size of the lattice spacing may also depend on the wavelength of RF signals that are transmitted/received by the antenna array. In this way, SIW band-pass filters 600 may be chosen that fit within the array lattice for any range of operational wavelengths for the antenna array.

Another possible benefit of the SIW band-pass filter 60 is to allow RFIC chips and other components to occupy the surface area of a substrate, such as an antenna substrate as described in other embodiments. Since the SIW band-pass filter 600 may advantageously be fully integrated within a substrate, no surface area on either side of the substrate is taken by the SIW band-pass filter 60. In some configurations, SIW band-pass filters 600 may be fully integrated within a substrate, one major surface of the substrate may be dedicated to an antenna array whereas the other major surface may be dedicated to packaged RFIC chips.

Still another possible advantage of the SIW band-pass filter is to allow for higher-order band-pass filters without increasing the occupied area of a substrate. For example, in the case of the SIW band-pass filter 600 described in reference to FIGS. 10A and 10B, a fifth-order band-pass filter may be formed by adding two more layers. The resulting substrate may be thicker, but the added thickness may be small when compared to a fifth-order transmission line filter or a fifth-order single layer waveguide filter.

Yet another possible benefit of the SIW band-pass filter 600 is that the Q-factor of the waveguide cavities 49 may be high resulting in lower losses when compared with transmission line filters. For example, the Q-factor of the waveguide cavities 49 may be about 200 at frequencies of 300 GHz for substrates including medium performance materials. Higher or lower performance materials may be used depending on performance and cost considerations of the SIW band-pass filter 60. A typical SIW band-pass filter 600 may advantageously have lower losses compared to a transmission line filter. For example, the insertion loss of the SIW band-pass filter 600 may be less than about 3 dB in some embodiments. In other embodiments, the insertion loss of the SIW band-pass filter 60 may be more than about 3 dB. For example, the insertion loss of the SIW band-pass filter 600 may be influenced by specific operational parameters and design considerations for a particular application.

Figure 11:
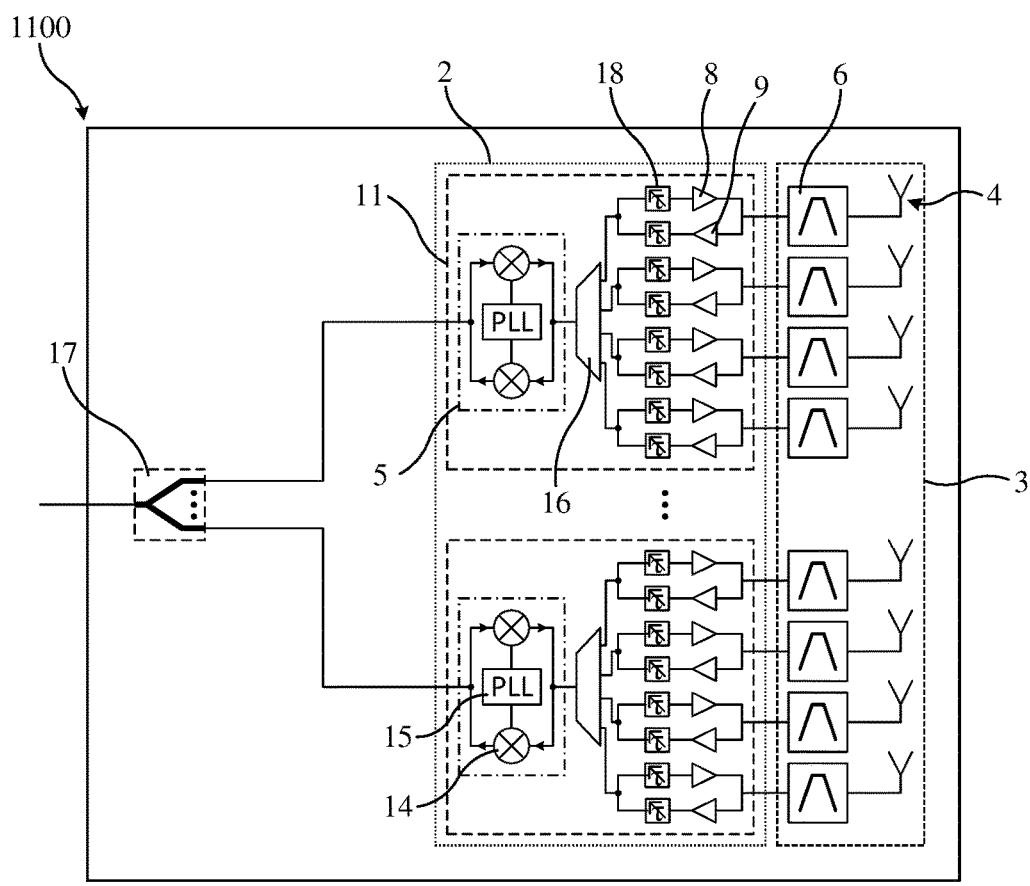
FIG. 11 illustrates a block diagram of a radio frequency module including radio frequency integrated circuit chips with integrated frequency converters and beamforming transmit/receive section in accordance with an embodiment of the invention.

FIG. 11 illustrates a block diagram of a radio frequency module including radio frequency integrated circuit chips with integrated frequency converters in accordance with an embodiment of the invention. The block diagram illustrated in FIG. 11 may be a specific embodiment a radio frequency module as described in previous embodiments. For example, the block diagram of a radio frequency module as shown in FIG. 11 may be a specific layout for the radio frequency module of FIG. 2.

Referring to FIG. 11, a radio frequency module 1100 includes an antenna substrate 3, a RF front end circuit 2, and a signal splitter 17. Like elements of the radio frequency module 1100 and the radio frequency module 1 are labeled using like numerical references and are as previously described. Specific description of such features has not been repeated here for reasons of brevity.

The signal splitter 17 may be connected to the RF front end circuit 2 which in turn may be connected to the antenna substrate 3. The signal splitter 17 may receive a single signal and split it into two or more signals. Additionally, the signal splitter 17 may combine two or more received signals into a single signal. In one embodiment, the signal splitter 17 may receive an RF signal at an intermediate frequency that is lower than the transmission frequency. The signal splitter 17 may be implemented as a resistive power divider, a reactive power divider, a Wilkinson power divider, and the like. In various embodiments, the signal splitter 17 may be a hybrid splitter configured to split power equally between outputs.

The RF front end circuit 2 may include one or more RFIC chips 11 in various embodiments. In one embodiment, the RF front end circuit includes sixteen RFIC chips 11. The RFIC chips 11 may perform various signal processing functions such as up/down conversion of a signal, signal splitting, signal combining, frequency modulating, phase shifting, time delay, and signal amplification, for example.

In some embodiments, each of the RFIC chips 11 includes a radio frequency converter 5. The radio frequency converter 5 may perform up/down conversion of RF signals. The radio frequency converter 5 may include a phase locked loop 15 and one or more mixers 14 as well as other components.

Each of the RFIC chips 11 may also include a power combiner 16. The power combiner 16 may combine signals from multiple sources into a single signal. Additionally, the power combiner 16 may split a single signal into multiple signals. The power combiner 16 may be implemented using a resistive power divider, a reactive power divider, or a Wilkinson power divider in various embodiments.

Each of the RFIC chips 11 may further include multiple phase shifters 18, power amplifiers 8, and low noise amplifiers 9 as shown in FIG. 11. A phase shifter 18 connected to a power amplifier 8 may shift the phase of a signal and amplify the signal before transmission of the signal. Similarly, a phase shifter 18 connected to a low noise amplifier 9 may amplify a signal and shift the phase of the signal after reception of the signal.

Still referring to FIG. 11, the antenna substrate 3 includes one or more filters 6 and one or more antennas 4. In one embodiment, the filters 6 and the antennas 4 are connected in a one-to-one relationship. The filters 6 may serve to filter a signal before transmission or after reception. A possible benefit of including the filters 6 is to limit spurious emissions and out-of-band emissions of RF signals that are outside the operational range of the radio frequency module 1100. For example, in various embodiments, the filters 6 are band-pass filters. In one embodiment, the band-pass filters are SIW band-pass filters. Band-pass filters may only allow signals that are in a range of allowable wavelengths to pass through the bend-pass filter. Such filters have been described previously in more detail such as in reference to FIGS. 2-9, 10A, and 10B.

In the configuration of FIG. 11, each antenna 4 is connected to a power amplifier 8, low noise amplifier 9, and two phase shifters 18. This may allow for each antenna 4 to act as a transmitter and a receiver in a time division duplex configuration. Other configurations are possible. For example, some or all of the antennas 4 in antenna substrate 3 may be dedicated to either transmitting or receiving RF signals. In one embodiment, each RFIC chip 11 is connected to four antennas 4. However, an RFIC chip 11 may be connected to any number of antennas 4 and is not limited to a configuration of four antennas per one RFIC chip 11.

Figure 12:
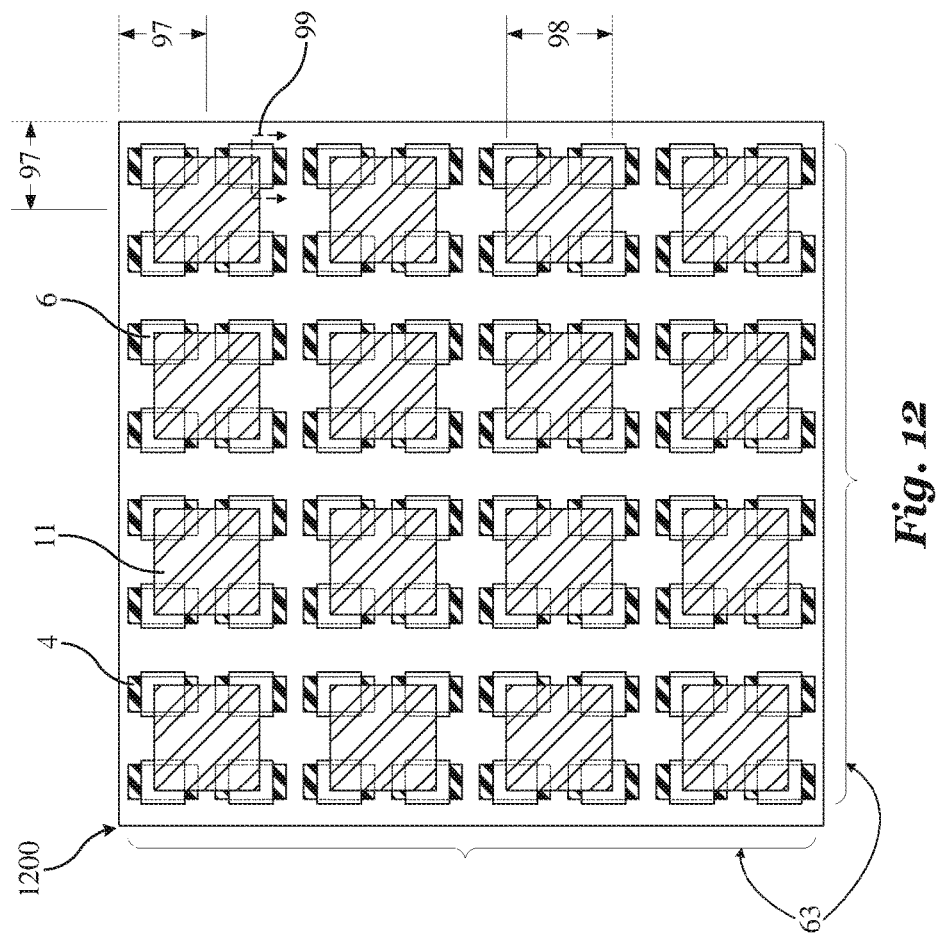
FIG. 12 illustrates a top view of a radio frequency module including an array of antenna elements in accordance with an embodiment of the invention.

FIG. 12 illustrates a top view of a radio frequency module including an array of antenna elements in accordance with an embodiment of the invention. The radio frequency module of FIG. 12 may be a specific implementation of a radio frequency module as described in reference to FIG. 2 with a layout similar to the block diagram described in reference to FIG. 11.

Referring to FIG. 12, multiple antennas 4 are arranged as an array of antenna elements 63 within a radio frequency module 1200. Filters 6 and RFIC chips 11 are also arranged within the boundaries of the array of antenna elements 63 in various embodiments. Like elements of the radio frequency module 1200 and the radio frequency module 1 are labeled using like numerical references and are as previously described. Specific description of such features has not been repeated here for reasons of brevity.

The array of antenna elements 63 may be configured to function as phased array for radar sensing or spatially resolved radio communication. In some cases, the RFIC chips 11 may be referred to as transmit/receive (T/R) chips. The radio frequency module 1200 may have one or more connection points to interface electromagnetically, electrically, or mechanically with additional packaging, modules, substrates, and/or circuits.

In one embodiment, beamforming may be implemented by the radio frequency module 1200 using a hybrid beamforming configuration. A possible advantage of a hybrid beamforming configuration is to reduce strain on both the digital processing side and the analog front end as compared to purely digital or purely analog beamforming configurations. The hybrid beamforming configuration may be a useful means of implementing channel estimation and applying weights in adaptive beamforming scenarios. Hybrid beamforming may provide the additional benefits of efficient channel estimation and application of consequent weights when operating in the millimeter wavelength.

In one embodiment, a single RFIC chip 11 may be connected to four filters 6 and four antennas 4 as shown. In alternative embodiments other combinations may be used. For example, each RFIC chip may be connected to eight antennas 4 and each antenna 4 may be connected to two filters 6. Numerous alternative configurations may be apparent to those of ordinary skill in the art and illustrated layouts are not intended to be limiting.

For reference purposes, FIG. 12 also shows representative dimensions of the radio frequency module 1200. These dimensions may also describe possible dimensions of similar features in other embodiments, where applicable.

The array of antenna elements 63 has a lattice spacing 97 that is between about 2.5 mm and about 7.5 mm in some embodiments. In one embodiment, the lattice spacing 97 is about 5 mm. The lattice spacing 97 may be determined by the range of wavelengths transmitted and/or received by the antennas 4. In some embodiments, lattice spacing 97 is about half of the primary operational wavelength. As a specific example, the wavelength of RF signals at 28 GHz is about 10.7 mm so the lattice spacing 97 may be about 5.35 mm. However, in many cases a band of wavelengths is used. An array of antenna elements 63 that operates in a band including 28 GHz may have a lattice spacing 97 of about 5 mm or about 5.5 mm for example. Any lattice spacing 97 is possible and may be different depending on application. The lattice spacing 97 in one direction may also be different than the lattice spacing in another direction.

Each of the RFIC chips 11 has an RFIC chip width 98 that is between about 2.5 mm and about 10 mm in various embodiments. In one embodiment, the RFIC chip width 98 is about 6.2 mm. In another embodiment, the RFIC chip width is about 4.5 mm. The RFIC chip width 98 may depend on the number and type of components in the radio frequency front end circuit as well as additional functionality that may be integrated into the RFIC chip 11. Additionally, the RFIC chip width 98 may be chosen based on the available area in the radio frequency package 1 which may be based on the lattice spacing 97 of the array of antenna elements 63. Any size of RFIC chip 11 is possible just as any size of lattice spacing 97 is possible.

The RFIC chips 11 illustrated in FIG. 12 are square, but the RFIC chips 11 may be any shape. Further, there is no limitation that the RFIC chips 11 all be the same size and/or shape. Some RFIC chips 11 may contain more or less circuitry depending on the application. In some cases, it may be beneficial to integrate as much of the radio frequency circuitry as possible into the RFIC chips 11. The radio frequency module 1200 may include an intermediate frequency (IF) distribution network, up/down converters, radio frequency splitting network that splits signals into analog front end channels, as well as an array of antenna elements 63. The radio frequency splitting network may include time delay elements, phase shifter elements, power amplifiers, and low noise amplifiers, for example. Integration of filters 6 between the antennas 4 and the RFIC chips 11 may provide the advantage of enabling efficient filtering of individual channels while limiting the size of the radio frequency module 1200 to the minimum size of the array of antenna elements 63. A possible advantage of integrating filters 6 in a multilayer configuration within a substrate is to reduce cost while maintaining filtering efficiency.

FIG. 12 illustrates a top view the radio frequency module 1200. In appropriate regions, such as cross-sectional region 99, structures may be as illustrated in FIGS. 2-8. Additionally, appropriate elements in FIG. 12 such as filter 6 may have a similar structure as illustrated in FIGS. 10A and 10B.

Figure 13:
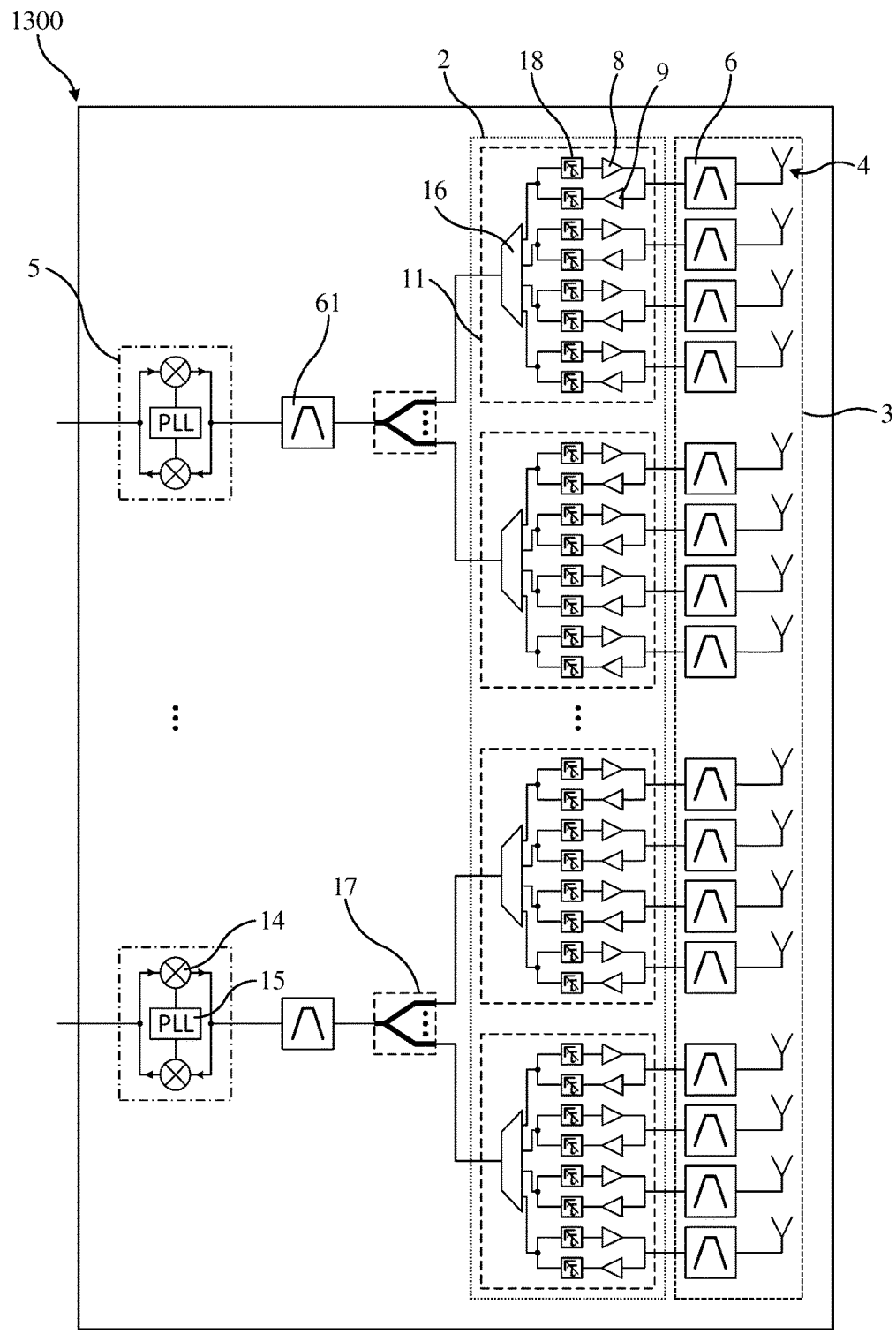
FIG. 13 illustrates a block diagram of a radio frequency module including radio frequency integrated circuit chips of beamforming transmit/receive section and separate radio frequency integrated circuit chips of frequency converters in accordance with an embodiment of the invention.

FIG. 13 illustrates a block diagram of a radio frequency module including radio frequency integrated circuit chips and separate frequency converters in accordance with an embodiment of the invention. The block diagram of a radio frequency module as shown in FIG. 13 may be a specific layout for the radio frequency module of FIG. 2, for example.

Referring to FIG. 13, a radio frequency module 1300 includes an antenna substrate 3, a RF front end circuit 2, signal splitters 17, filters 6, and radio frequency converters 5. Like elements of the radio frequency module 130000 and the radio frequency modules 1 and 1100 are labeled using like numerical references and are as previously described. Specific description of such features has not been repeated here for reasons of brevity.

The RF front end circuit 2 includes two or more RFIC chips 11 that do not include radio frequency converters 5. The radio frequency converters 5 are included separately such that each radio frequency converter 5 may connect to multiple RFIC chips 11.

Filters 61 may also be included between the RF front end circuit 2 and radio frequency converters 5 as shown in FIG. 13. These may be implemented in the signal distribution network. For example, the filters 61 that are directly connected to the radio frequency converters 5 may be in the antenna substrate 3. Alternatively, the filters 61 may also be implemented as components attached to the antenna substrate 3. The filters 61 may also be implemented on a different substrate.

Additionally, filters 61 may be included separate from the RF front end circuit 2 to filter the output of each radio frequency converter 5 before the output is split and sent to each RFIC chip 11. As before, although only two radio frequency converters 5 and four RFIC chips 11 are shown, any number of any component may be included depending on signal processing functionality. Additional circuit components may also be present that are not shown in the block diagram.

Figure 14:
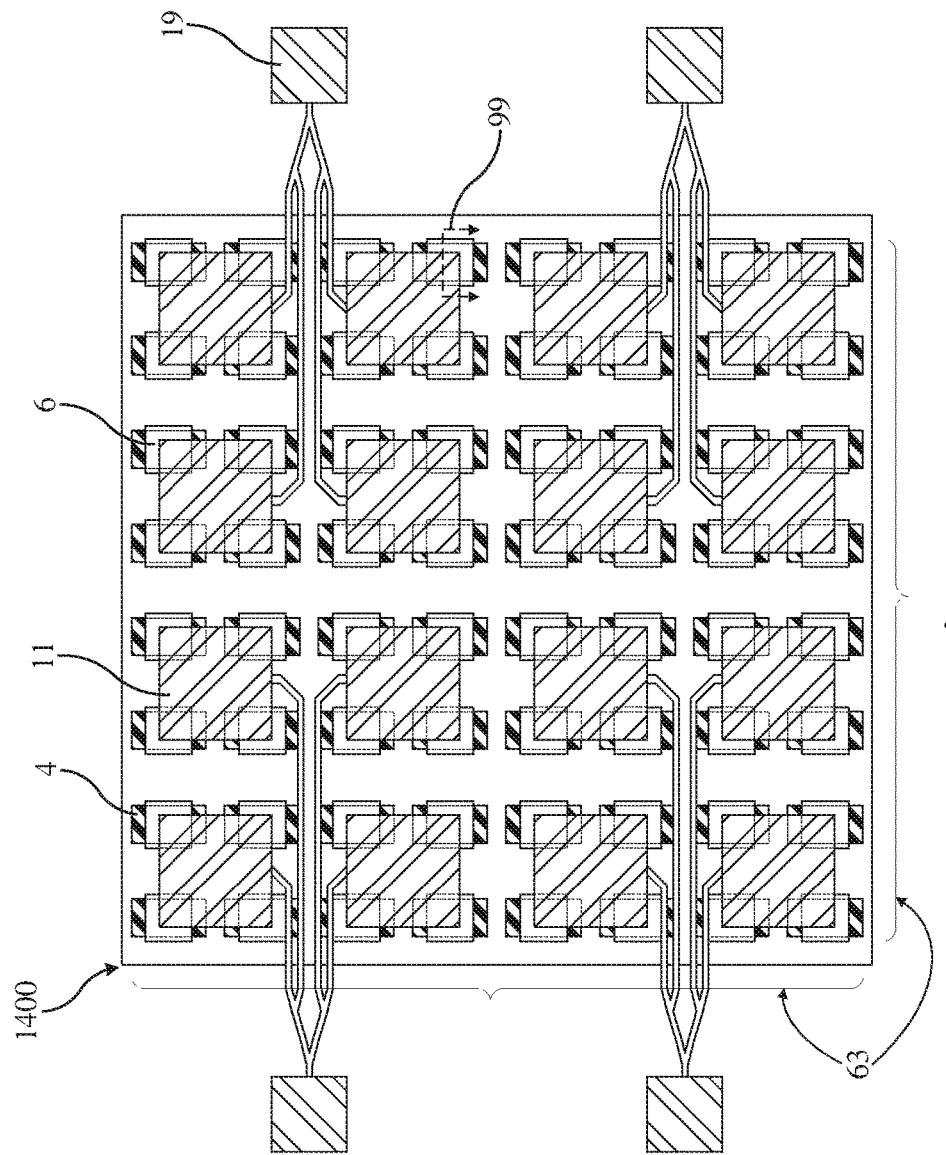
FIG. 14 illustrates a top view of a radio frequency module including an array of antenna elements in accordance with an embodiment of the invention.
Figure 15:
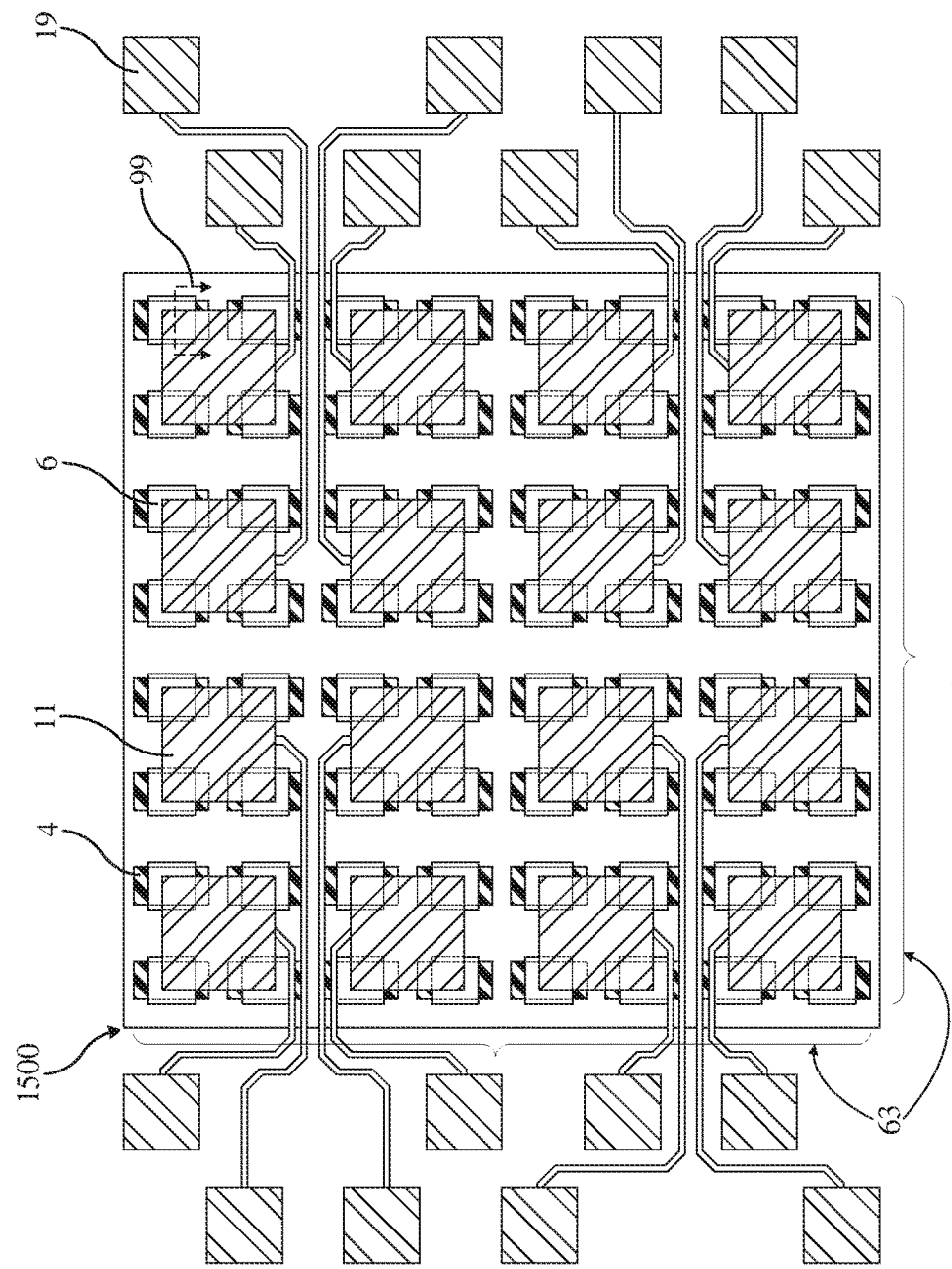
FIG. 15 illustrates a top view of a radio frequency module including an array of antenna elements in accordance with an embodiment of the invention.

FIG. 14 illustrates a top view of a radio frequency module including an array of antenna elements while FIG. 15 illustrates a top view of another radio frequency module including an array of antenna elements in accordance with embodiments of the invention. The RF modules of FIGS. 14 and 15 may be specific implementations of a radio frequency module as illustrated in FIG. 2 with a circuit layout similar to the layout described in reference to FIG. 13.

Referring to FIG. 14, multiple antennas 4 are arranged as an array of antenna elements 63 with filters 6 and RFIC chips 11 in a radio frequency module 1400. Multiple RF converter chips 19 are implemented separately from the RFIC chips 11. Like elements of the radio frequency module 140000 and the radio frequency modules 1 and 1200 are labeled using like numerical references and are as previously described. Specific description of such features has not been repeated here for reasons of brevity.

As before, the array of antenna elements 63 may be configured to function as phased array in some embodiments. In one embodiment, beamforming may be implemented by the radio frequency module 1400 using a hybrid beamforming configuration. Each RF converter chip 19 feeds four RFIC chips 11 in one embodiment. The RF converter chips 19 may be disposed on the antenna substrate 3 with the RFIC chips 11 or be implemented on a separate substrate.

The number of RFIC chips 11 fed by each RF converter chip 19 is not limited to four RFIC chips 11 per RF converter chip 19. Any number and configuration is possible and may be chosen at the based on desired operation and design considerations.

Referring to FIG. 15, a radio frequency module 1500 is shown that includes a single RF converter chip 19 feeding each of the multiple RFIC chips 11. Like elements of the radio frequency module 1500 and the radio frequency modules 1 and 1200 are labeled using like numerical references and are as previously described. Specific description of such features has not been repeated here for reasons of brevity.

As before, the array of antenna elements 63 may be configured to function as phased array in some embodiments and is an active phased array configuration in one embodiment. In one embodiment, the RF convert chips 19 and the RFIC chips 11 are connected in a one-to-one relationship. In other embodiments, any number of RF converter chips 19 may be connected to any number of RIC chips 11. All other elements are as previously described.

Figure 16:
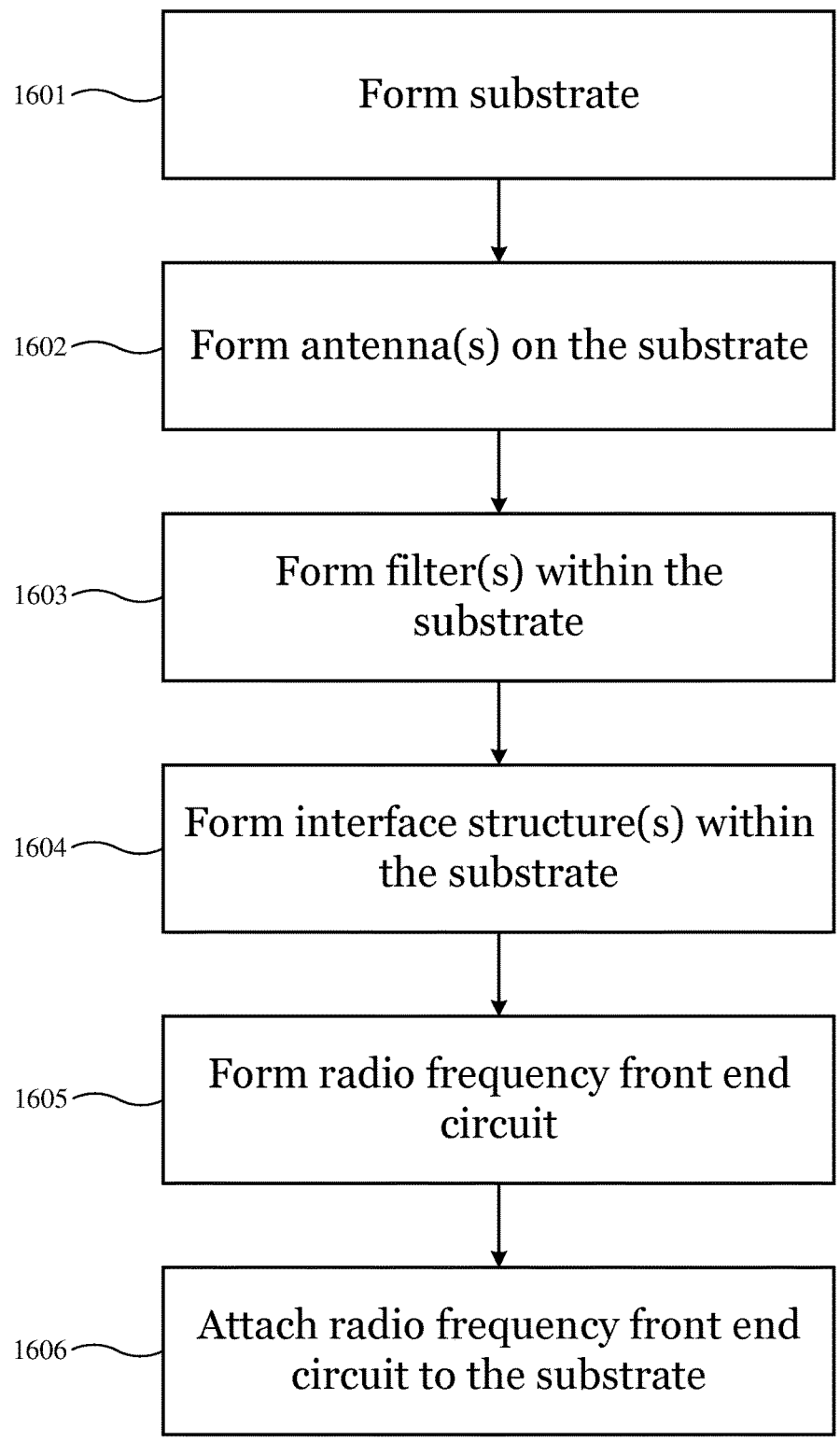
FIG. 16 illustrates a method of forming a radio frequency module in accordance with an embodiment of the invention.

FIG. 16 illustrates a method of forming a radio frequency module in accordance with an embodiment of the invention.

Referring to FIG. 16, a method of forming a radio frequency module may include a step 1601 of forming a substrate. In some embodiments, the substrate formed in step 1601 may be an antenna substrate as previously described. In one embodiment, the substrate may be a PCB. The substrate may contain one or more dielectric layers and one or more conductive layers. Some or all of the layers may be laminated. Some or all of the layers may be patterned to form redistribution lines, transmission lines, and device components using techniques known in the art.

The method may further include a step 1602 of forming one or more antennas on the substrate. Alternatively, some or all of the one or more antennas may be formed within the substrate. The one or more antennas formed in step 1602 may be configured to transmit and/or receive RF signals. The one or more antennas formed in step 1602 may be any type of antenna as previously described in reference to FIGS. 3-9 and are not required to be identical. The one or more antennas formed in step 1602 may be arranged in an array of antenna elements on the substrate.

The array of antenna elements may be as previously described. In one embodiment, the radio frequency module is configured to electronically adjust the spatial direction of RF signals during transmission of the RF signals. In one embodiment, the array of antenna elements is configured to function as a phased array. In one embodiment, the phased array is configured to function as an active phased array configured to individually adjust the signal power of RF signals at the one or more antennas during transmission of the RF signals.

Still referring to FIG. 16, the method may further include a step 1603 of forming one or more filters within the substrate. In various embodiments, the filters formed in step 1603 are SIW filters and are as previously described. In various embodiments, the filters formed in step 1603 are band-pass filters and are as previously described. In some embodiments, the filters formed in step 1603 are SIW band-pass filters and are multilayer band-pass filters in one embodiment. A multilayer filter may extend vertically through two or more layers of the substrate.

Step 1603 of forming one or more filters within the substrate may further include coupling the one or more filters to the one or more antennas formed in step 1602. In one embodiment, the coupling of the one or more filters to the one or more antennas may be in a one-to-one relationship. In other words, each filter may be coupled to one antenna. In other embodiments, other configurations are possible as previously described.

Referring again to FIG. 16, the method may further include a step 1604 of forming one or more interface structures within the substrate. In various embodiments, the interface structures formed in step 1604 comprise multiple conductive layers and laminate layers and are as previously described. For example, the interface structures formed in step 1604 may provide coupling between transmission lines and filters. The coupling may be direct coupling such as via coupling or indirect coupling such as aperture coupling.

It should be noted that the method steps described herein may be performed in any order. For example, the order of steps 1601, 1602, 1603, and 1604 may be rearranged. In some embodiments, the antennas are formed before the filters and the interface structures are formed. In other embodiments, the interface structures are formed before the filters and the antennas. Additionally, the interface structures, filters and/or antennas may be formed as part of the step of forming the substrate.

The method may further include a step 1605 of forming a RF front end circuit. The RF front end circuit may be as previously described. In some embodiments, 1605 of forming the RF front end circuit also includes coupling the RF front end circuit to the one or more interface structures formed in step 1604, the one or more filters formed in step 1603, and/or one or more antennas formed in step 1602. Optionally, various structures such as transmission lines, redistribution lines, solder balls, conductive pillars, and the like may also be formed on and within the substrate to enable coupling to additional components and circuitry.

In various embodiments, step 1605 of forming the RF front end circuit further includes forming one or more radio frequency converters. The one or more radio frequency converters may be up/down converters in one embodiment. The one or more radio frequency converters may be configured to transfer RF signals to the one or more antennas formed in step 1604. Each radio frequency converter may transfer RF signals to one or more of the antennas. For example, in an embodiment where multiple antennas are formed on the substrate, a first radio frequency converter may transfer RF signals to a first subset of the multiple antennas and a second radio frequency converter may transfer RF signals to a second subset of the multiple antennas. In this specific example it should also be noted that that the first subset and the second subset are distinct.

In some embodiments, step 1605 of forming the RF front end circuit also includes forming one or more phase shifters coupled to the one or more filters formed in step 1603. Step 1604 also includes forming one or more power amplifiers coupled to the one or more filters, in various embodiments. Other components may be included in the RF front end circuit as previously described and may be formed during step 1604. These components include, but are not limited to low noise amplifiers, variable amplifiers, filters, oscillators, mixers, phase locked loops, analog-digital converters, demodulators, and digital signal processors.

The method may further include a step 1606 of attaching the RF front end circuit to the substrate. For example, the RF front end circuit may be integrated into an RF integrated circuit (RFIC) chip and then be subsequently attached to the substrate. In one embodiment, the RF front end circuit is attached to a side of the substrate that is opposite to a side containing antenna elements. The RF front end circuit formed in step 1605 may alternatively be integrated into the substrate.

The substrate may be configured to transfer RF signals between the RF front end circuit, the one or more filters, and the one or more antennas. In other words, the structure of the substrate may facilitate paths for RF signals to travel between the antennas and the RF front end circuit. The RF signal paths may be formed using waveguides, transmission lines, or a combination thereof.

Figure 17:
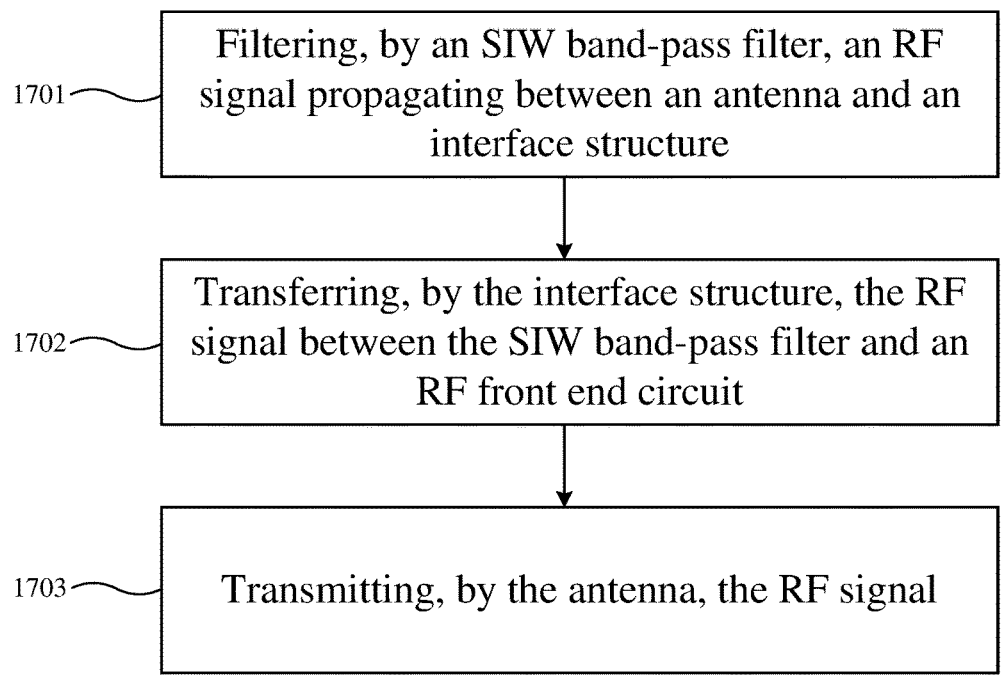
FIG. 17 illustrates a method of operating a radio frequency module in accordance with an embodiment of the invention.

FIG. 17 illustrates a method of operating a radio frequency module in accordance with an embodiment of the invention. The method of FIG. 17 may be a specific method of operating a radio frequency module as illustrated in FIG. 2 and FIGS. 11-15.

Referring to FIG. 17, a method of operating a radio frequency module may include a step 1701 of filtering, by an SIW band-pass filter, an RF signal propagating between an antenna and an interface structure. The radio frequency module, SIW band-pass filter, and interface structure may be as previously described in reference to FIGS. 2-9, 10A, 10B, and 11-15, for example. In various alternative embodiments, the filtering may be performed by a different type of filter depending on specific functionality of the radio frequency module.

The antenna may be located at a first side of a substrate within the radio frequency module. The interface structure may be located at a second side of the substrate that is opposite the first side. The SIW band-pass filter may be located between the antenna and the interface structure within the substrate. The SIW band-pass filter may be coupled to both the antenna and the interface structure using direct or indirect coupling such that an RF signal may propagate between the antenna and the interface structure through the SIW band-pass filter. For example, the SIW band-pass filter may be coupled to both the antenna and the interface structure using aperture coupling. Alternatively, the SIW band-pass filter may be coupled to both the antenna and the interface structure using via coupling. As another option, the SIW band-pass filter may be coupled to the interface structure using via coupling while the antenna is coupled to the SIW band-pass filter using aperture coupling. Other forms of direct and indirect coupling as well as other combinations are possible.

The method may further include a step 1702 of transferring, by the interface structure, the RF signal between the SIW band-pass filter and an RF front end circuit. The RF front end circuit may be as previously described in reference to FIGS. 2-9 and FIGS. 11-16, for example. The interface structure may be configured to directly or indirectly couple an RF front circuit to the SIW band-pass filter. The interface structure may also include transmission lines, redistribution lines, solder balls, conductive pillars, and the like. Some or all of the RF front end circuit may be included in an RFIC chip which may be located at the second side of the substrate. Alternatively, the RF front end circuit may be integrated directly on or within the substrate or be located external to the substrate.

The method may further include a step 1703 of transmitting, by the antenna, the RF signal. Alternatively or additionally, the method may also include the step of receiving, by the antenna, RF signals. For example, the antenna may be configured only to transmit RF signals, only to receive RF signals, or to transmit and receive RF signals using a time division duplex (TDD) mode of operation.

Example embodiments of the present invention are summarized here. Other embodiments can also be understood from the entirety of the specification and the claims filed herein.

Example 1

A method of operating a radio frequency (RF) module, the method including: filtering, by a substrate integrated waveguide (SIW) band-pass filter, an RF signal propagating between an antenna and an interface structure, where the antenna is disposed at a first side of a substrate, the interface structure is disposed at a second side of the substrate opposite the first side, and the SIW band-pass filter is disposed within the substrate between the antenna and the interface structure; and transferring, by the interface structure, the RF signal between the SIW band-pass filter and an RF front end circuit.

Example 2

The method of example 1, where the antenna includes a plurality of antennas; the SIW band-pass filter includes a plurality of SIW band-pass filters, where each antenna of the plurality of antennas is coupled to a corresponding SIW band-pass filter of the plurality of band-pass filters; and the interface structure includes a plurality of interface structures, where each interface structure of the plurality of interface structures is coupled to the corresponding SIW band-pass filter of the plurality of SIW band-pass filters, and a corresponding terminal of the RF front end circuit.

Example 3

The method of one of examples 1 and 2, further including transmitting the RF signal from the antenna.

Example 4

The method of one of examples 1 to 3, further including electronically adjusting a spatial direction of the RF signal, the electronically adjusting including adjusting a phase of the RF signal propagating from the from the plurality of antennas.

Example 5

The method of one of examples 1 to 4, where the RF front end circuit is disposed on the second side of the substrate.

Example 6

The method of one of examples 1 to 5, where the substrate is a printed circuit board, and the SIW band-pass filter extends through multiple layers of the printed circuit board.

Example 7

The method of one of examples 1 to 6, where the RF signal includes a frequency in a range of frequencies, and an insertion loss of the SIW band-pass filter is less than 3 dB for any frequency in the range of frequencies.

Example 8

A radio frequency (RF) module including an antenna disposed at a first side of a substrate; an interface structure disposed at a second side of the substrate opposite the first side; and a substrate integrated waveguide (SIW) band-pass filter disposed within the substrate between the antenna and the interface structure, where the SIW band-pass filter is configured to filter an RF signal propagating between the antenna and the interface structure, and the interface structure is configured to be coupled to an RF front end circuit.

Example 9

The RF module of example 8, where the antenna includes a plurality of antennas; the SIW band-pass filter includes a plurality of SIW band-pass filters, where each antenna of the plurality of antennas is coupled to a corresponding SIW band-pass filter of the plurality of band-pass filters; and the interface structure includes a plurality of interface structures, where each interface structure of the plurality of interface structures is coupled to the corresponding SIW band-pass filter of the plurality of SIW band-pass filters.

Example 10

The RF module of one of examples 8 and 9, where the antenna is configured to transmit the RF signal.

Example 11

The RF module of one of examples 8 to 10, further including the RF front end circuit, where the RF front end circuit is configured to electronically adjust a spatial direction of the RF signal by adjusting respective phases of RF signals propagating between the RF front end circuit and each of the plurality of antennas.

Example 12

The RF module of one of examples 8 to 11, further including the RF front end circuit disposed on the second side of the substrate.

Example 13

The RF module of one of examples 8 to 12, where the substrate is a printed circuit board, and the SIW band-pass filter extends through multiple layers of the printed circuit board.

Example 14

The RF module of one of examples 8 to 13, where the RF signal includes a frequency in a range of frequencies, and an insertion loss of the SIW band-pass filter is less than 3 dB for any frequency in the range of frequencies.

Example 15

A semiconductor device module including: a first antenna disposed at a first laminate layer of a substrate, the first laminate layer being disposed at a first side of the substrate; a first band-pass filter coupled to the first antenna, the first band-pass filter including a first waveguide cavity disposed in a second laminate layer of the substrate, the second laminate layer being disposed below the first laminate layer; and an interface structure coupled to the first band-pass filter, the interface structure being disposed at a third laminate layer of the substrate, the third laminate layer being disposed at a second side of the substrate opposite the first side of the substrate, where the interface structure is configured to be coupled to a radio frequency integrated circuit (RFIC) chip.

Example 16

The semiconductor device module of example 15, where the first band-pass filter further includes: a second waveguide cavity disposed in a fourth laminate layer of the substrate, the fourth laminate layer being disposed between the first laminate layer and the third laminate layer; and a slot configured to couple the second waveguide cavity to the first waveguide cavity.

Example 17

The semiconductor device module of one of examples 15 and 16, where the first band-pass filter further includes a first conductive surface disposed at a first side of the first band-pass filter, a second conductive surface disposed at a second side of the first band-pass filter opposite the first side of the first band-pass filter, and a plurality of vias disposed around a perimeter of the first band-pass filter, the plurality of vias being coupled to the first conductive surface and the second conductive surface, where the first conductive surface, the plurality of vias, and the second conductive surface enclose the first band-pass filter.

Example 18

The semiconductor device module of one of examples 15 to 17, further including: a slot disposed within the substrate between the first antenna and the first band-pass filter, the slot being configured to couple the first antenna to the first band-pass filter; and a second waveguide cavity disposed between the first antenna and the slot, the second waveguide cavity including an insulator in a gaseous state.

Example 19

The semiconductor device module of one of examples 15 to 18, further including a plurality of vias disposed at the first side of the substrate and along a perimeter of the first band-pass filter, where the plurality of vias extend into the substrate from a first surface disposed at the first side of the substrate, and the plurality of vias at least partially surrounds both the first antenna and the first band-pass filter.

Example 20

The semiconductor device module of one of examples 15 to 19, where the plurality of vias further extend from the first surface out of the substrate.

It should be noted that the designations of "top" and "bottom" in reference to features of the invention are merely convenient labels and do not necessarily reflect the orientation of the features in all embodiments. For example, it may be conceivable for the embodiment radio frequency device modules described herein to be mounted with the top surface facing an external support. Therefore, in some cases the top surface may more accurately be described as the bottom surface of the device package. Similarly, the radio frequency device modules may be attached at an angle relative to an external support or casing.

While this invention has been described with reference to illustrative embodiments, this description is not intended to be construed in a limiting sense. Various modifications and combinations of the illustrative embodiments, as well as other embodiments of the invention, may be apparent to persons skilled in the art upon reference to the description. It is therefore intended that the appended claims encompass any such modifications or embodiments.

What is claimed is:

1. A method of operating a radio frequency (RF) module, the method comprising:
   filtering, by a substrate integrated waveguide (SIW) band-pass filter, an RF signal propagating between an antenna and an interface structure, wherein
      the antenna is disposed at a first side of a substrate,
      the interface structure is disposed at a second side of the substrate opposite the first side,
      the SIW band-pass filter is disposed within the substrate between the antenna and the interface structure, and
      the SIW band-pass filter is coupled to the antenna by a rectangular slot disposed between the antenna and the SIW band-pass filter; and
   transferring, by the interface structure, the RF signal between the SIW band-pass filter and an RF front end circuit.

2. The method of claim 1, wherein:
   the antenna comprises a plurality of antennas;
   the SIW band-pass filter comprises a plurality of SIW band-pass filters, wherein each antenna of the plurality of antennas is coupled to a corresponding SIW band-pass filter of the plurality of SIW band-pass filters; and
   the interface structure comprises a plurality of interface structures, wherein each interface structure of the plurality of interface structures is coupled to
      the corresponding SIW band-pass filter of the plurality of SIW band-pass filters, and
      a corresponding terminal of the RF front end circuit.

3. The method of claim 2, further comprising electronically adjusting a spatial direction of the RF signal, the electronically adjusting comprising adjusting a phase of the RF signal propagating from the from the plurality of antennas.

4. The method of claim 1, wherein the RF front end circuit is disposed on the second side of the substrate.

5. The method of claim 1, wherein
   the substrate is a printed circuit board, and
   the SIW band-pass filter extends through multiple layers of the printed circuit board.

6. The method of claim 1, wherein
   the RF signal comprises a frequency in a range of frequencies, and
   an insertion loss of the SIW band-pass filter is less than 3 dB for any frequency in the range of frequencies.

7. The method of claim 1, wherein the RF signal comprises a frequency between 27.5 GHz and 300 GHz.

8. The method of claim 1, wherein the filtering by the SIW band-pass filter comprises propagating a transverse electric (TE) mode of the RF signal through the SIW band-pass filter between the antenna and the interface structure.

9. A radio frequency (RF) module comprising:
   an antenna disposed at a first side of a substrate;
   an interface structure disposed at a second side of the substrate opposite the first side;
   a substrate integrated waveguide (SIW) band-pass filter disposed within the substrate between the antenna and the interface structure; and
   a rectangular slot disposed between the antenna and the SIW band-pass filter, wherein
      the SIW band-pass filter is coupled to the antenna by the rectangular slot,
      the SIW band-pass filter is configured to filter an RF signal propagating between the antenna and the interface structure, and
      the interface structure is configured to be coupled to an RF front end circuit.

10. The RF module of claim 9, wherein
    the antenna comprises a plurality of antennas;
    the SIW band-pass filter comprises a plurality of SIW band-pass filters, wherein each antenna of the plurality of antennas is coupled to a corresponding SIW band-pass filter of the plurality of SIW band-pass filters; and
    the interface structure comprises a plurality of interface structures, wherein each interface structure of the plurality of interface structures is coupled to the corresponding SIW band-pass filter of the plurality of SIW band-pass filters.

11. The RF module of claim 10, further comprising the RF front end circuit, wherein the RF front end circuit is configured to electronically adjust a spatial direction of the RF signal by adjusting respective phases of RF signals propagating between the RF front end circuit and each of the plurality of antennas.

12. The RF module of claim 9, further comprising the RF front end circuit disposed on the second side of the substrate.

13. The RF module of claim 9, wherein
    the substrate is a printed circuit board, and
    the SIW band-pass filter extends through multiple layers of the printed circuit board.

14. The RF module of claim 9, wherein
    the RF signal comprises a frequency in a range of frequencies, and
    an insertion loss of the SIW band-pass filter is less than 3 dB for any frequency in the range of frequencies.

15. The RF module of claim 9, wherein the RF signal comprises a frequency between 27.5 GHz and 300 GHz.

16. The RF module of claim 9, wherein the SIW band-pass filter is further configured to propagate a transverse electric (TE) mode of the RF signal through the SIW band-pass filter between the antenna and the interface structure.

17. A semiconductor device module comprising:
    a first antenna disposed at a first laminate layer of a substrate, the first laminate layer being disposed at a first side of the substrate;
    a first band-pass filter coupled to the first antenna, the first band-pass filter comprising a first waveguide cavity disposed in a second laminate layer of the substrate, the second laminate layer being disposed below the first laminate layer;
    a rectangular slot disposed in a first conductive layer of the substrate, the first conductive layer being between the first laminate layer and the second laminate layer, wherein the first band-pass filter is coupled to the first antenna by the rectangular slot; and
    an interface structure coupled to the first band-pass filter, the interface structure being disposed at a third laminate layer of the substrate, the third laminate layer being disposed at a second side of the substrate opposite the first side of the substrate, wherein the interface structure is configured to be coupled to a radio frequency integrated circuit (RFIC) chip.

18. The semiconductor device module of claim 17, wherein the first band-pass filter further comprises:
    a second waveguide cavity disposed in a fourth laminate layer of the substrate, the fourth laminate layer being disposed between the first laminate layer and the third laminate layer; and a slot configured to couple the second waveguide cavity to the first waveguide cavity.

19. The semiconductor device module of claim 17, wherein the first band-pass filter further comprises
  a first conductive surface disposed at a first side of the first band-pass filter,
  a second conductive surface disposed at a second side of the first band-pass filter opposite the first side of the first band-pass filter, and
  a plurality of vias disposed around a perimeter of the first band-pass filter, the plurality of vias being coupled to the first conductive surface and the second conductive surface, wherein the first conductive surface, the plurality of vias, and the second conductive surface enclose the first band-pass filter.

20. The semiconductor device module of claim 17, further comprising:
  a slot disposed within the substrate between the first antenna and the first band-pass filter, the slot being configured to couple the first antenna to the first band-pass filter; and
  a second waveguide cavity disposed between the first antenna and the slot, the second waveguide cavity comprising an insulator in a gaseous state.

21. The semiconductor device module of claim 17, further comprising a plurality of vias disposed at the first side of the substrate and along a perimeter of the first band-pass filter, wherein
  the plurality of vias extend into the substrate from a first surface disposed at the first side of the substrate, and
  the plurality of vias at least partially surrounds both the first antenna and the first band-pass filter.

22. The semiconductor device module of claim 21, wherein the first antenna is disposed on the first surface, and wherein the plurality of vias further extend from the first surface out of the substrate.

23. The semiconductor device module of claim 17, wherein the first waveguide cavity comprises:
  a rectangular cross-section along a direction normal to a surface of the substrate disposed at the first side of the substrate;
  a first linear dimension of the rectangular cross-section; and
  a second linear dimension of the rectangular cross-section perpendicular to the first linear dimension, wherein the second linear dimension is greater than the first linear dimension.

* * * * *